(12) United States Patent
Ooishi

(10) Patent No.: US 6,291,869 B1
(45) Date of Patent: Sep. 18, 2001

(54) SEMICONDUCTOR CIRCUIT DEVICE HAVING HIERARCHICAL POWER SUPPLY STRUCTURE

(75) Inventor: Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/307,779

(22) Filed: May 10, 1999

(30) Foreign Application Priority Data

Nov. 30, 1998 (JP) .................................................. 10-340250

(51) Int. Cl.⁷ .................................................. H01L 29/00
(52) U.S. Cl. ........................ 257/500; 365/226; 365/227
(58) Field of Search .................................. 365/226, 228, 365/227, 229, 189.11, 189.09; 257/500

(56) References Cited

U.S. PATENT DOCUMENTS 5,659,517 * 8/1997 Arimoto et al. ...................... 365/226
5,856,951 * 1/1999 Arimoto et al. ...................... 365/226
5,959,927 * 9/1999 Yamagata et al. .................... 365/229

FOREIGN PATENT DOCUMENTS 06-237164  8/1994 (JP) ...................................... 365/226

* cited by examiner

*Primary Examiner*—Olik Chaudhuri
*Assistant Examiner*—Nathan W. Ha
(74) *Attorney, Agent, or Firm*—McDermott, Will & Emery

(57) ABSTRACT

Inverters having the same output logic level in a stand-by mode are connected between buffer power supply and ground lines. Inverters having the same output logic level which is different from the above mentioned output logic level are connected between buffer power supply and ground lines. Power supply selectors connecting the buffer power supply line to a main or sub power supply line and connecting the buffer ground line to a main or sub ground line in accordance with an output signal from a latch circuit are provided. Thus, leakage current in a logic circuit in which a logic level is not determined is reduced in the stand-by mode.

16 Claims, 18 Drawing Sheets

SEMICONDUCTOR CIRCUIT DEVICE HAVING HIERARCHICAL POWER SUPPLY STRUCTURE

BACKGROUND OF THE INVENTION

1. Field of the Invention

The present invention relates to semiconductor circuit devices and, more specifically to a semiconductor circuit device having a hierarchical power supply structure.

2. Description of the Background Art

In a recent semiconductor memory, a threshold value of a transistor is becoming lower with decrease in an operating power supply voltage. To prevent an increase in subthreshold leakage current which is caused by the decrease in the threshold value of the transistor, various SCRC (Subthreshold Current Reduced Control) techniques are developed (see for example Japanese Patent Laying-Open No. 6-237164).

An internal control of a DRAM (Dynamic Random Access Memory) is divided into two types of operations, that is, row and column related operations. With recent tendency toward multiply banks and an independent operation for every bank, a structure of a circuit for controlling a bank is becoming more complicated. In addition, the number of circuits in a whole chip increases, thereby resulting in an increase in leakage current during stand-by.

According to the above described SCRC technique, a hierarchical power supply structure has been proposed to reduce subthreshold leakage current during such stand-by. In the hierarchical power supply structure, sub power supply and ground lines are provided in addition to main power supply and ground lines, a logic circuit such as a CMOS (Complementary Metal Oxide Semiconductor) inverter circuit outputting a signal at an H (logic high) level during stand-by is connected between the main and sub power supply lines, and a logic circuit such as a CMOS inverter circuit outputting a signal at an L (logic low) level is connected between the sub power supply line and the main ground line, so that the sub power supply and ground lines are electrically disconnected from the main power supply and ground lines during stand-by, respectively.

In such hierarchical power supply structure, a source of a P channel MOS transistor in the CMOS inverter circuit outputting the signal at the H level is connected to the main power supply line, whereas a source of an N channel MOS transistor is connected to the sub ground line. Thus, a source potential of the N channel MOS transistor is higher than a ground potential during stand-by, so that subthreshold leakage current for the N channel MOS transistor is reduced. On the other hand, a source of an N channel MOS transistor in the CMOS inverter circuit outputting the signal at the L level is connected to the main ground line, whereas a source of a P channel MOS transistor is connected to the sub power supply line. Thus, a source potential of the P channel MOS transistor is lower than a power supply potential during stand-by, so that subthreshold leakage current for the P channel MOS transistor is reduced.

Although the above described hierarchical power supply structure can be employed for a logic circuit in which a logic level of an output signal during stand-by is determined, it cannot be employed for that in which the logic level is not determined. Thus, such logic circuit has to be connected between the main power supply and ground lines, whereby subthreshold leakage current cannot be reduced during stand-by.

In a latch circuit, particularly, reduction in subthreshold leakage current cannot be achieved by the above described hierarchical power supply structure as a logic level of a signal to be latched is not determined during stand-by.

SUMMARY OF THE INVENTION

An object of the present invention is to provide a semiconductor circuit device capable of reducing subthreshold leakage current even in a logic circuit in which a logic level of an output signal is not determined during stand-by.

Another object of the present invention is to provide a semiconductor circuit device capable of reducing subthreshold leakage current in a latch circuit.

According to one aspect of the present invention, a semiconductor circuit device having an operation mode and a stand-by mode includes main and sub power supply lines, a first switching element, main and sub ground lines, a second switching element, first buffer power supply and ground lines, second buffer power supply and ground lines, a plurality of first logic circuits, a plurality of second logic circuits and a selection circuit. The main power supply line receives a power supply voltage. The first switching element is connected between the main and sub power supply lines, and turned on and off in the operation and stand-by modes, respectively. The main ground line receives a ground voltage. The second switching element is connected between the main and sub ground lines, and turned on and off in the operation and stand-by modes, respectively. Each of the first logic circuits is connected between the first buffer power supply and ground lines for supplying an output signal at a first logic level in the stand-by mode. Each of the second logic circuits is connected between the second buffer power supply and ground lines for supplying an output signal at a second logic level which is complementary to the first logic level in the stand-by mode. The selection circuit connects the first buffer power supply and ground lines and second buffer power supply and ground lines to the main power supply line, sub ground line, sub power supply line and the main ground line, respectively, when the plurality of first logic circuits supply signals at a logic high level as the first logic level and the plurality of second logic circuits supply output signals at a logic low level as the second logic level in the stand-by mode. The selection circuit also connects the first buffer power supply and ground lines and the second buffer power supply and ground lines to the sub power supply line, main ground line, main power supply line and sub ground line, respectively, when the plurality of first logic circuits supply output signals at a logic low level as the first logic level and the plurality of second logic circuits supply output signals at a logic high level as the second logic level in the stand-by mode.

In the above described semiconductor circuit device, the logic circuit is selectively connected between the main power supply line and sub ground line or between the sub power supply line and main ground line in accordance with a logic level of the output signal to be supplied from the logic circuit. Thus, reduction in subthreshold leakage current is achieved by the hierarchical power supply structure even in the case of a logic circuit in which the logic level of the output signal in the stand-by mode is not determined.

According to another aspect of the present invention, a semiconductor circuit device having operation and stand-by modes includes main and sub power supply lines, a first switching element, main and sub ground lines, a second switching element, a plurality of first logic circuits, a plurality of second logic circuits and a voltage supplying circuit. The main power supply line receives a power supply voltage. The first switching element is connected between the main and sub power supply lines, and turned on and off in the operation and stand-by modes, respectively. The main ground line receives a ground voltage. The second switching element is connected between the main and sub ground lines, and turned on and off in the operation and stand-by modes, respectively. Each of the first logic circuits is connected between the main power supply line and the sub ground line for supplying an output signal at a first logic level in the stand-by mode. Each of the second logic circuits is connected between the sub power supply line and the main ground line for supplying an output signal at a second logic level which is complementary to the first logic level in the stand-by mode. The voltage supplying circuit supplies a voltage which is lower than the ground voltage for the sub ground line when the plurality of first logic circuits supply output signals at a logic low level as the first logic level and the plurality of second logic circuits supply output signals at a logic high level as the second logic level in the stand-by mode. The voltage supplying circuit also supplies a voltage which is higher than the power supply voltage for the sub power supply line when the plurality of first logic circuits supply output signals at a logic high level as the first logic level and the plurality of second logic circuits supply output signals at a logic low level as the second logic level in the stand-by mode.

In the above described semiconductor circuit device, the voltage which is lower than the ground voltage is supplied for the sub ground line or the voltage which is higher than the power supply voltage is supplied for the sub power supply line in accordance with the logic level of the output signal to be supplied from the logic circuit. Thus, reduction in subthreshold leakage current is achieved by the hierarchical power supply structure even in the case of the logic circuit in which the logic level of the output signal is not determined.

According to still another aspect of the present invention, a semiconductor circuit device having operation and stand-by modes includes a main power supply line, a switching element, a main ground line, latch fixed power supply and ground lines, a plurality of logic circuits, a latch circuit and a blocking circuit. The switching element is connected between a node receiving a power supply voltage and the main power supply line, and turned on and off in the operation and stand-by modes, respectively. The latch fixed power supply line receives the power supply voltage. The latch fixed ground line receives a ground voltage. Each of the logic circuits is connected between the main power supply and ground lines. The latch circuit is connected between the latch fixed power supply and ground lines. The blocking circuit blocks a signal input to the latch circuit in the stand-by mode.

In the above described semiconductor circuit device, subthreshold leakage current hardly flows in the logic circuit as the switching element is off in the stand-by mode. However, the latch circuit can continue to latch a signal even in the stand-by mode as the power supply and ground voltages are supplied for the latch circuit. In addition, the latch circuit is prevented from latching a random signal as the signal input to the latch circuit is blocked in the stand-by mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
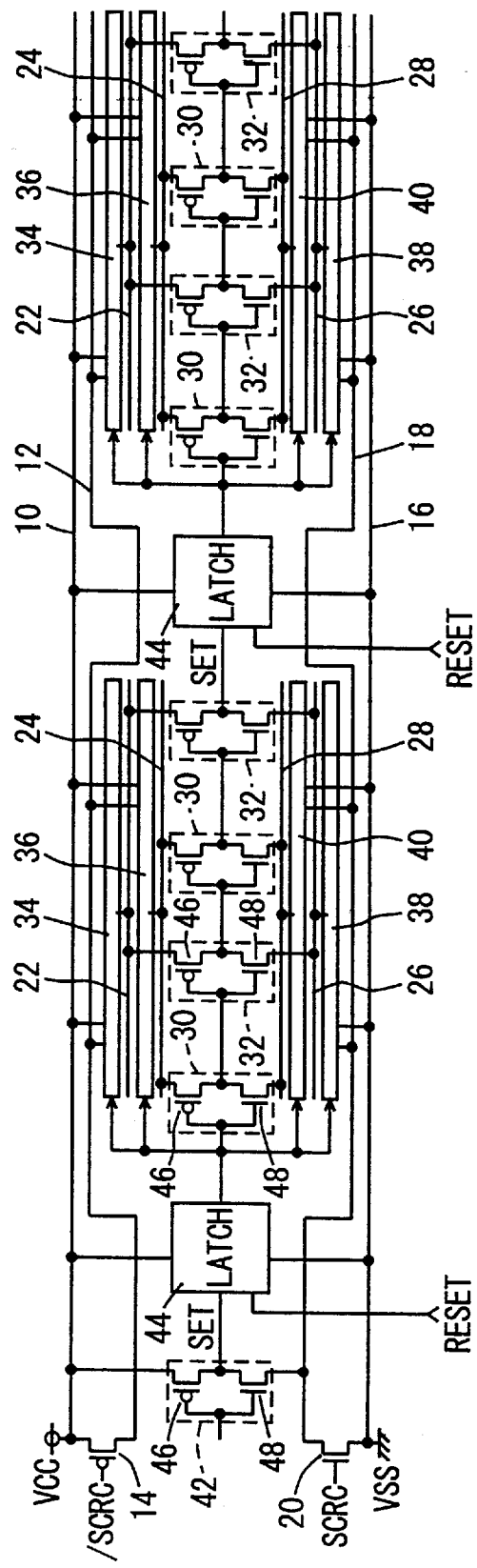
FIG. 1 is circuit diagram showing a structure of a semiconductor circuit device according to a first embodiment of the present invention.

Embodiments of the present invention will now be described in detail with reference to the drawings. It is noted that the same or corresponding portions in the drawings are denoted by the same reference numerals, and therefore description thereof will not be repeated.

First Embodiment

Referring to FIG. 1, a semiconductor circuit device includes main and sub power supply lines 10 and 12, a P channel MOS transistor 14, main and sub ground lines 16 and 18, an N channel MOS transistor 20, buffer power supply lines 22 and 24, buffer ground lines 26 and 28, CMOS inverter circuits 30 and 32, and power supply selectors 34, 36, 38 and 40.

Main power supply line 10 receives a power supply voltage VCC. Transistor 14 is connected between main and sub power supply lines 10 and 12 and having its gate receiving a control signal/SCRC. Control signal/SCRC attains to an L level in an operation mode and to an H level in a stand-by mode. Thus, transistor 14 is a switching element which is turned on and off respectively in the operation and stand-by modes. Transistor 20 is connected between main and sub ground lines 16 and 18 and having its gate receiving a control signal SCRC. Control signal SCRC is a signal which is complementary to control signal/SCRC, and attains to the H and L levels respectively in the operation and stand-by modes. Thus, transistor 20 is a switching element which is turned on and off respectively in the operation and stand-by modes.

Inverter circuit 32 is connected between buffer power supply and ground lines 22 and 26 for outputting a signal at a first logic level in the stand-by mode. Inverter circuit 30 is connected between buffer power supply and ground lines 24 and 28 for outputting a signal at a second logic level which is complementary to the first logic level in the stand-by mode.

Power supply selector 34 selects main power supply line 10 or sub power supply line 12 for connecting it to buffer power supply line 22. More specifically, power supply select 34 selects main power supply line 10 for connecting it to buffer power supply line 22 in the operation mode, and connects buffer power supply line 22 to main and sub power supply lines 10 and 12 when inverter circuit 32 outputs signals at the H and L levels in the stand-by mode, respectively.

Power supply selector 36 selects main power supply line 10 or sub power supply line 12 for connecting it to buffer power supply line 24. More specifically, power supply selector 36 selects sub power supply line 12 for connecting it to buffer power supply line 24 in the operation mode, and connects buffer power supply line 24 to main and sub power supply lines 10 and 12 when inverter circuit 30 outputs signals at the H and L levels in the stand-by mode, respectively.

Power supply selector 38 selects main ground line 16 or sub ground line 18 for connecting it to buffer ground line 26. More specifically, power supply selector 38 selects main ground line 16 for connecting it to buffer ground line 26 in the operation mode, and connects buffer ground line 26 to sub and main ground lines 18 and 16 when inverter circuit 32 outputs signals at the H and L levels in the stand-by mode, respectively.

Power supply selector 40 selects main ground line 16 or sub ground line 18 for connecting it to buffer ground line 28. More specifically, power supply selector 40 selects sub ground line 18 for connecting it to buffer ground line 28 in the operation mode, and connects buffer ground line 28 to main and sub ground lines 16 and 18 when inverter circuit 30 outputs signals at the L and H levels in the stand-by mode, respectively.

The semiconductor circuit device further includes a CMOS inverter circuit 42 and a latch circuit 44. Inverter circuit 42 always outputs a signal at the H level in response to an input signal at the L level in the stand-by mode. Thus, inverter circuit 42 is connected between main power supply line 10 and sub ground line 18. On the other hand, latch circuit 44 latches a signal at the H or L level during stand-by, and an output signal thereof is not determined. Thus, latch circuit 44 is connected between main power supply line 10 and main ground line 16.

Each of inverter circuits 30, 32 and 42 includes a P channel MOS transistor 46 and an N channel MOS transistor 48.

Figure 2:
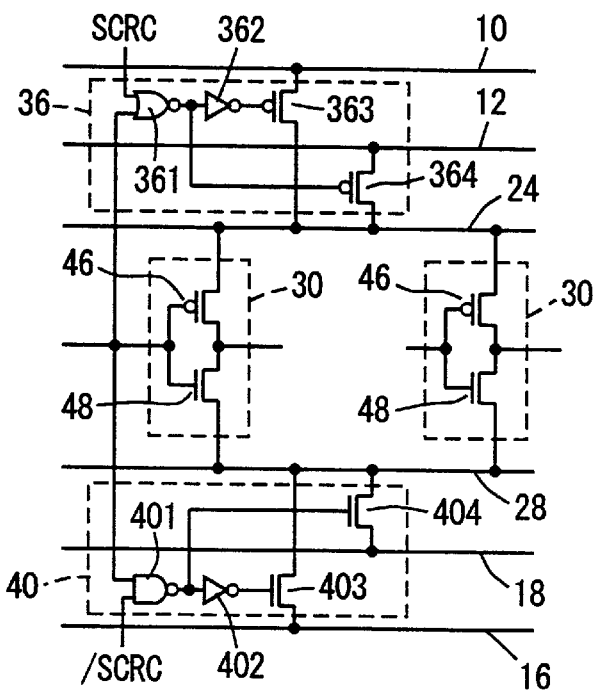
FIG. 2 is a circuit diagram showing a structure of a power supply selector shown in FIG. 1.

FIG. 2 is a circuit diagram showing structures of power supply selectors 36 and 40. Referring to FIG. 2, power supply selector 36 includes an NOR circuit 361, an inverter circuit 362 and P channel MOS transistors 363 and 364. Power supply selector 40 includes an NAND circuit 401, an inverter circuit 402, and N channel MOS transistors 403 and 404.

NOR circuit 361 receives an output signal from latch circuit 44 (an input signal to inverter circuit 30) and control signal SCRC. An output signal from NOR circuit 361 is applied to a gate of transistor 363 through inverter circuit 362 and also applied directly to a gate of transistor 364. Thus, when control signal SCRC is at the H level, transistors 363 and 364 are respectively turned off and on, and buffer power supply line 24 is short-circuited to sub power supply line 12. On the other hand, when control signal SCRC is at the L level, transistors 363 and 364 are alternately turned on and off in response to an output signal from latch circuit 44. More specifically, when the output signal from latch circuit 44 is at the H level, transistors 363 and 364 are respectively turned off and on. On the other hand, when the output signal from latch circuit 44 is at the L level, transistors 363 and 364 are respectively turned on and off.

NAND circuit 401 receives an output signal from latch circuit 44 (the input signal to inverter circuit 30) and control signal/SCRC. An output signal from NAND circuit 401 is applied to a gate of transistor 403 through inverter circuit 402 and also applied directly to a gate of transistor 404. Thus, when control signal/SCRC is at the L level, transistors 403 and 404 are respectively turned off and on. On the other hand, when control signal/SCRC is at the L level, transistors 403 and 404 are alternately turned on and off in response to the output signal from latch circuit 44. More specifically, when the output signal from latch circuit 44 is at the H level, transistors 403 and 404 are respectively turned on and off. On the other hand, when the output signal from latch circuit 44 is at the L level, transistors 403 and 404 are respectively turned off and on.

Power supply selectors 34 and 38 have similar structures as those of power supply selectors 36 and 40, respectively.

Now, an operation of the semiconductor circuit device having the above mentioned structure will be described.

The semiconductor circuit device has operation and stand-by modes. In the operation mode, control signals SCRC and /SCRC respectively attain to the H and L levels. Thus, transistors 14 and 20 are turned on, and sub power supply and ground lines 12 and 18 are respectively short-circuited to main power supply and ground lines 10 and 16.

Buffer power supply lines 22 and 24 are short-circuited to sub power supply line 12 by power supply selectors 34 and 36, respectively. Buffer ground lines 26 and 28 are short-circuited to sub ground line 18 by power supply selectors 38 and 40, respectively.

As a result, in the operation mode, buffer power supply lines 22 and 24 receive a power supply voltage VCC, and buffer ground lines 26 and 28 receive a ground voltage VSS. Thus, normal operation of the semiconductor circuit device is ensured.

On the other hand, in the stand-by mode, control signals SCRC and /SCRC attain to the L and H levels, respectively.

Thus, transistors 14 and 20 are turned off, and sub power supply and ground lines 12 and 18 are electrically disconnected from main power supply and ground lines 10 and 16, respectively.

As inverter circuit 42 always receives an input signal at the L level in the stand-by mode, an output signal at the H level is always supplied for latch circuit 44 as a set signal SET. Here, a source of P channel MOS transistor 46 in inverter circuit 42 is connected to main power supply line 10, so that power supply voltage VCC is output as the output signal at the H level. On the other hand, a source of N channel MOS transistor 48 is connected to sub ground line 18, so that subthreshold leakage current in transistor 48 is reduced.

Although latch circuit 44 always receives set signal SET at the H level in the stand-by mode, the level of a reset signal RESET is not determined. Accordingly, latch circuit 44 latches a signal either at the H or L level in the stand-by mode.

As the level of the output signal from latch circuit 44 is not determined in the stand-by mode, a logic level of the output signal from each of inverter circuits 30 and 32 is not determined in the stand-by mode. More specifically, when latch circuit 44 outputs a signal at the H level, inverter circuits 30 and 32 output signals at the L and H levels, respectively. On the other hand, when latch circuit 44 outputs a signal at the L level, inverter circuits 30 and 32 output signals at the H and L levels, respectively.

When latch circuit 44 outputs a signal at the H level, transistors 363 and 364 in power supply selector 36 are respectively turned off and on, so that buffer power supply line 24 is short-circuited to sub power supply line 12. Further, transistors 403 and 404 in power supply selector 40 are respectively turned on and off, so that buffer ground line 28 is short-circuited to main ground line 16.

Similarly, buffer power supply and ground lines 22 and 26 are short-circuited to main power supply line 10 and sub ground line 18 by power supply selectors 34 and 38, respectively.

As a result, all of inverter circuits 30 outputting signals at the L level are connected between sub power supply line 12 and main ground line 16, and all of inverter circuits 32 outputting signals at the H level are connected between main power supply line 10 and sub ground line 18. Thus, subthreshold leakage current in P channel MOS transistor 46 of inverter circuit 30 and that in N channel MOS transistor 48 of inverter circuit 32 are reduced.

When latch circuit 44 outputs a signal at the L level, transistors 363 and 364 in power supply selector 36 are respectively turned on and off, so that buffer power supply line 24 is short-circuited to main power supply line 10. Further, transistors 403 and 404 in power supply selector 40 are respectively turned off and on, so that buffer ground line 28 is short-circuited to sub ground line 10. Similarly, buffer power supply and ground lines 22 and 26 are short-circuited to sub power supply line 12 and main ground line 16 by power supply selectors 34 and 38.

As a result, all of inverter circuits 30 outputting signals at the H level are connected between main power supply line 10 and sub ground line 18, and all of inverter circuit 32 outputting signals at the L level are connected between sub power supply line 12 and main ground line 16. Thus, subthreshold leakage current in N channel MOS transistor 48 of inverter circuit 30 and that in P channel MOS transistor 46 of inverter circuit 32 are reduced.

In order to reduce subthreshold leakage current in latch circuit 44 which is connected between main power supply and ground lines 10 and 16, it is desirable that latch circuit 44 has the following structure.

Figure 3:
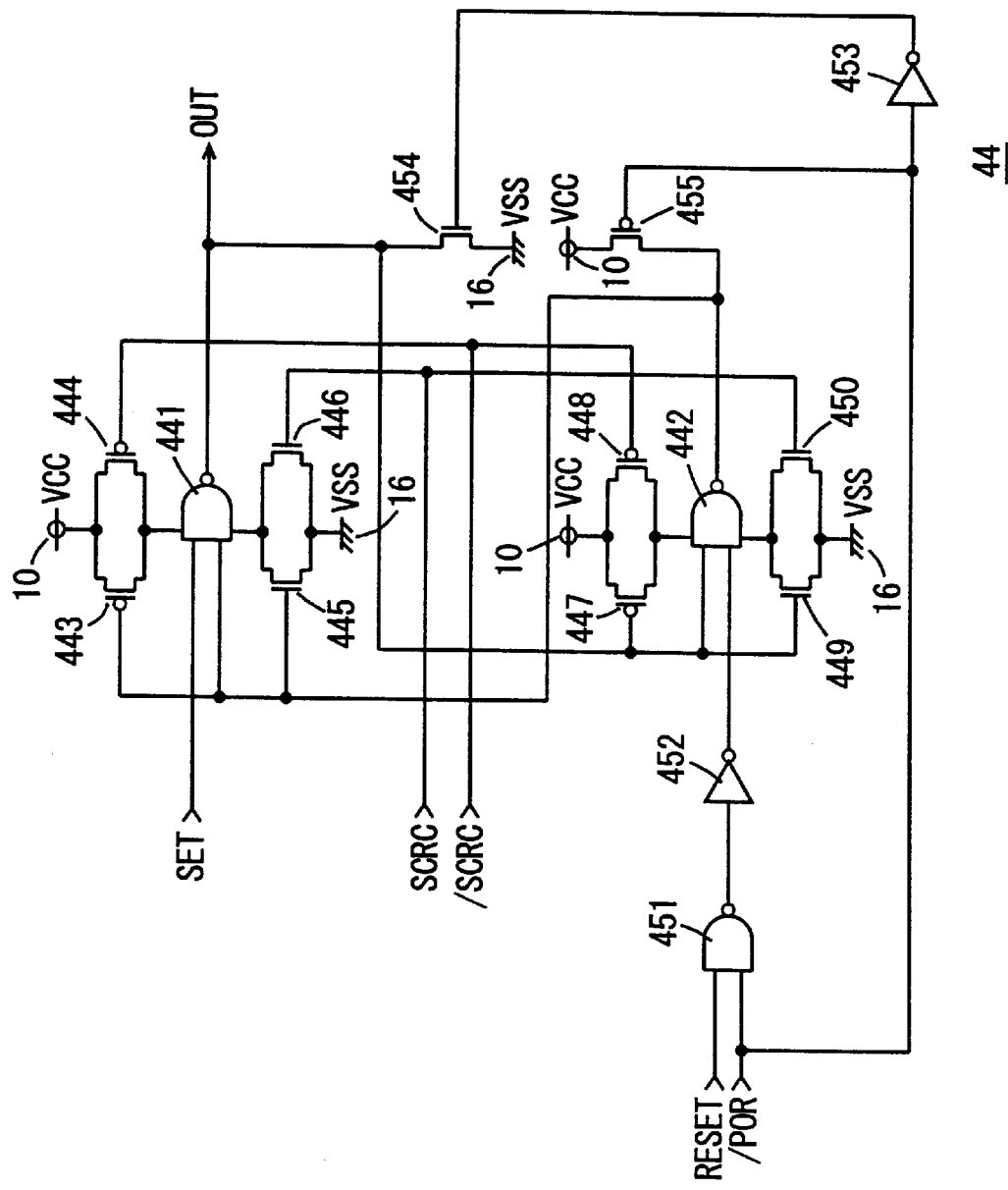
FIG. 3 is a circuit diagram showing a structure of a latch circuit shown in FIG. 1.

FIG. 3 is a circuit diagram showing a structure of latch circuit 44. Referring to FIG. 3, latch circuit 44 includes: NAND circuits 441 and 442 mutually connected to form an RS flip-flop; P channel MOS transistors 443 and 444 connected in parallel on the side of a power supply source for NAND circuit 441; N channel MOS transistors 445 and 446 connected in parallel on the side of a ground for NAND circuit 441; P channel MOS transistors 447 and 448 connected in parallel on the side of a power supply source for NAND circuit 442; N channel MOS transistors 449 and 450 connected in parallel on the side of a ground for NAND circuit 442; an NAND circuit 451; inverter circuits 452 and 453; an N channel MOS transistor 454 connected between an output node of NAND circuit 441 and a main ground line 16; and a P channel MOS transistor 455 connected between main power supply line 10 and an output node of NAND circuit 442.

Preferably, threshold values of transistors 443 to 450 are set higher than those of the other transistors (those in NAND circuits 441 and 442, for example).

NAND circuit 451 receives reset signal RESET and a power on reset signal/POR. An output signal from NAND circuit 451 is applied to NAND circuit 442 through inverter 452. Power on reset signal/POR is directly applied to a gate of transistor 455, and also applied to a gate of transistor 454 through inverter 453. As power on reset signal/POR is at the L level for a prescribed period of time after a power supply source is turned on, transistors 454 and 455 are both turned on. Thus, NAND circuits 441 and 442 output signals at the L and H levels, respectively. As described above, latch circuit 44 is reset when the power supply source is turned on.

In the operation mode, control signals SCRC and/SCRC respectively attain to the H and L levels, so that transistors 444, 446, 448 and 450 are all turned on. As power supply voltage VCC and ground voltage VSS are supplied for NAND circuits 441 and 442, normal operation of latch circuit 441 is in ensured.

On the other hand, in the stand-by mode, control signals SCRC and/SCRC respectively attain to the L and H levels, so that transistors 444, 446, 448 and 450 are all turned off. When latch circuit 44 outputs a signal at the H level, that is, when NAND circuits 441 and 442 respectively output signals at the H and L levels, transistors 443 and 449 are turned on and transistors 445 and 447 are turned off. Although power supply voltage VCC is output from NAND circuit 441 as an output signal at the H level, subthreshold leakage current in NAND circuit 441 is reduced. In addition, although ground voltage VSS is output from NAND circuit 442 as an output signal at the L level, subthreshold leakage current in NAND circuit 442 is reduced.

When latch circuit 44 outputs a signal at the L level, that is, when NAND circuits 441 and 442 respectively output signals at the L and H levels, transistors 445 and 447 are turned on and transistors 443 and 449 are turned off. Thus, although ground voltage VSS is output from NAND circuit 441 as an output signal at the L level, subthreshold leakage current in NAND circuit 441 is reduced. In addition, although power supply voltage VCC is output from NAND circuit 442 as an output signal at the H level, subthreshold leakage current in NAND circuit 442 is reduced.

As described above, according to the first embodiment, buffer power supply line 22 is connected to main power supply line 10 or sub power supply line 12, buffer power supply line 24 is connected to sub power supply line 12 or main power supply line 10, buffer ground line 26 is connected to sub ground line 18 or main ground line 16 and buffer ground line 28 is connected to main ground line 16 or sub ground line 18 in accordance with the output signal from latch circuit 44. Subthreshold leakage current can be reduced by the hierarchical power supply structure even in the case of inverter circuits 30 and 32 in which the logic level of the output signal in the stand-by mode is not determined.

In addition, transistors 443, 445, 447 and 449 are turned on or off in accordance with the output signals from NAND circuits 441 and 442, so that subthreshold leakage current in latch circuit 44 is reduced.

Second Embodiment

Figure 4:
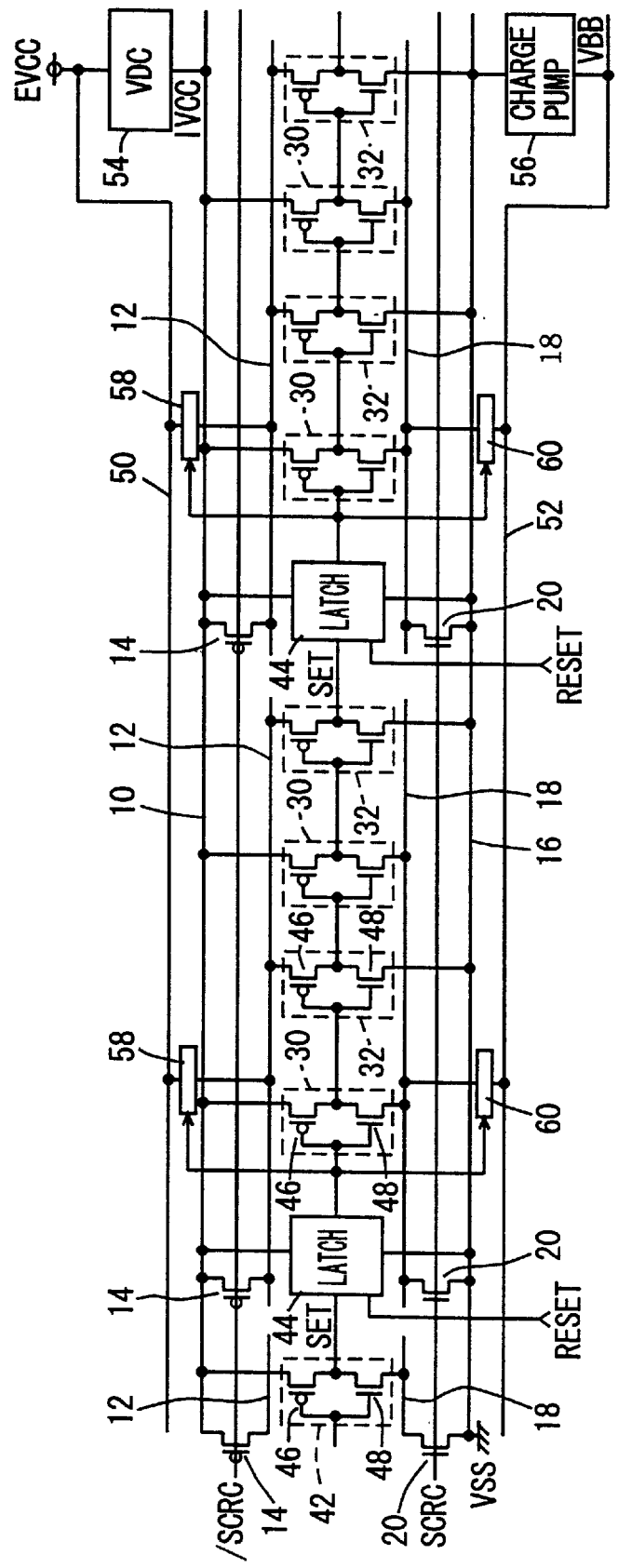
FIG. 4 is a circuit diagram showing a structure of a semiconductor circuit device according to a second embodiment of the present invention.

Referring to FIG. 4, in addition to the above described structure shown in FIG. 1, a semiconductor circuit device includes an external power supply line 50, a negative power supply line 52, a voltage down converter (VDC) 54 and a charge pump circuit 56. Voltage down converter 54 down converts an external power supply voltage EVCC and generates an internal power supply voltage IVCC which is lower than external power supply voltage EVCC for supplying it for a main power supply line 10. Charge pump circuit 56 generates a negative voltage VBB which is lower than a ground voltage VSS for supplying it for negative power supply line 52.

The semiconductor circuit device includes power supply selectors 58 and 60 in place of power supply selectors 34, 36, 38 and 40 shown in FIG. 1. Power supply selector 58 supplies external power supply voltage EVCC which is higher than internal power supply voltage IVCC for sub power supply line 12 by connecting sub power supply line 12 to external power supply line 50 when an inverter circuit 32 outputs a signal at an H level in a stand-by mode. Power supply selector 60 supplies negative voltage VBB which is lower than ground voltage VSS for sub ground line 18 by connecting sub ground line 18 to negative power supply line 52 when inverter circuit 30 outputs a signal at an L level.

The semiconductor circuit device does not include buffer power supply lines 22, 24 and buffer ground lines 26, 28 as shown in FIG. 1. Thus, inverter circuit 30 outputting a signal at a first logic level in the stand-by mode is connected between main power supply line 10 and sub ground line 18, and inverter circuit 32 outputting a signal at a second logic level which is complementary to the first logic level in the stand-by mode is connected between sub power supply line 12 and main ground line 16. Although logic levels of signals output from inverter circuits 30 and 32 in the stand-by mode are not determined, inverter circuits 30 and 32 are connected between power supply lines 10, 12 and ground lines 16, 18 in the above described manner.

Figure 5:
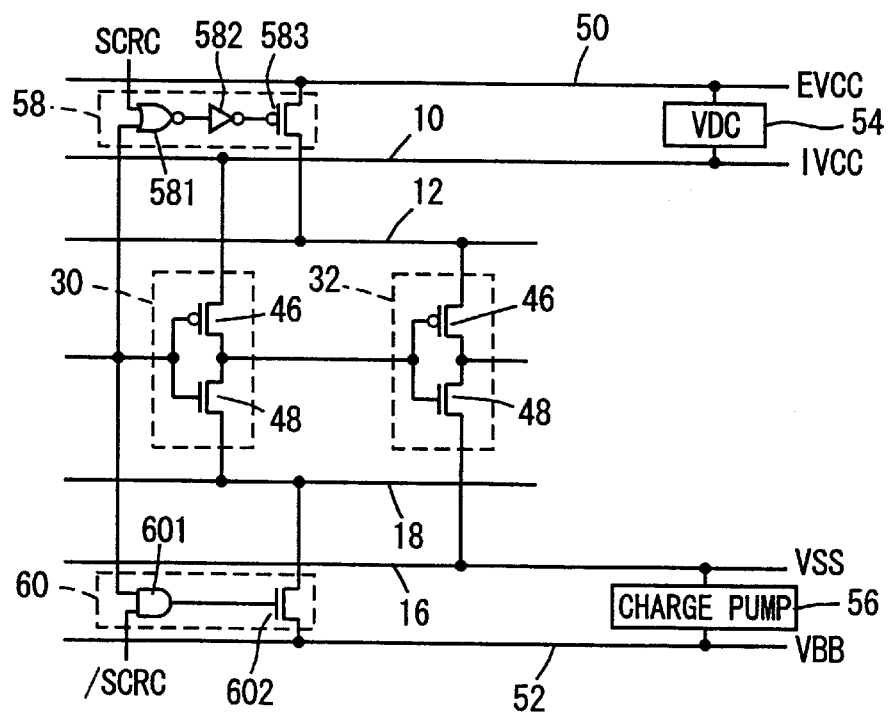
FIG. 5 is a circuit diagram showing a structure of a power supply selector shown in FIG. 4.

FIG. 5 is a circuit diagram showing structures of power supply selectors 58 and 60. Referring to FIG. 5, power supply selector 58 includes an NOR circuit 581, an inverter circuit 582 and a P channel MOS transistor 583. NOR circuit 581 receives an output signal from latch circuit 44 (an input signal to inverter circuit 30) and a control signal SCRC. An output signal from NOR circuit 581 is applied to a gate of a transistor 583 through inverter circuit 582. Power supply selector 60 includes an AND circuit 601 and an N channel MOS transistor 602. AND circuit 601 receives the output signal from latch circuit 44 (an input signal to inverter circuit 30) and a control signal/SCRC. An output signal from AND circuit 601 is directly applied to a gate of a transistor 602.

Thus, when control signals SCRC and/SCRC are respectively at the H and L levels, transistors 583 and 602 are both turned off. On the other hand, when control signals SCRC and/SCRC are respectively at the L and H levels, transistors 583 and 602 are alternately turned on or off in response to the output signal from latch circuit 44. More specifically, when the output signal from latch circuit 4 is at the H level, transistors 583 and 602 are respectively turned off and on. Thus, sub ground line 18 is short-circuited to negative power supply line 52. On the other hand, when the output signal from latch circuit 44 is at the L level, transistors 583 and 602 are respectively turned on and off. Thus, sub power supply line 12 is short-circuited to external power supply line 50.

Now, an operation of the semiconductor circuit device having the abode described structure will be described.

In an operation mode, control signals SCRC and/SCRC respectively attain to the H and L levels, so that sub power supply and ground lines 12 and 18 are respectively short-circuited to main power supply and ground lines 10 and 16. Then, transistors 583 and 602 are turned off, and therefore sub power supply and ground lines 12 and 18 are not respectively connected to external power supply line 50 and negative power supply line 52. As a result, normal operation of the semiconductor circuit device is ensured.

On the other hand, in a stand-by mode, control signals SCRC and/SCRC respectively attain to the L and H levels, so that sub power supply and ground lines 12 and 18 are electrically disconnected from main power supply and ground lines 10 and 16, respectively. It is noted that sub power supply line 12 is slightly charged with subthreshold leakage current of transistor 14 even when transistor 14 is turned off. Similarly, sub ground line 16 is slightly charged with subthreshold leakage current of transistor 20 even when transistor 20 is turned off.

When latch circuit 44 outputs a signal at the H level in the stand-by mode, sub ground line 18 is short-circuited to negative power supply line 52 by power supply selector 60. At the time, N channel MOS transistor 48 of inverter circuit 30 is turned on, so that negative voltage VBB is applied to gates of transistors 46 and 48 of inverter circuit 32. As a source voltage of N channel MOS transistor 48 of inverter circuit 32 is ground voltage VSS, subthreshold leakage current in transistor 48 is reduced.

On the other hand, when the output signal from latch circuit 44 is at the L level, sub power supply line 12 is short-circuited to external power supply line 50 by power supply selector 58. At the time, P channel MOS transistor 46 of inverter circuit 30 is turned on, so that internal power supply voltage IVCC is applied to gates of transistors 46 and 48 of inverter circuit 32. As a source voltage of N channel MOS transistor 46 of inverter circuit 32 is external power supply voltage EVCC which is higher than internal power supply voltage IVCC, subthreshold leakage current in transistor 46 is reduced.

According to the above described second embodiment, negative voltage VBB which is lower than ground voltage VSS is supplied for sub ground line 18 when the output signal from latch circuit 44 is at the H level, and external power supply voltage EVCC which is higher than internal power supply voltage IVCC is supplied for sub power supply line 12 when the output signal from latch circuit 44 is at the L level even in the case of inverter circuits 30 and 32 in which logic levels of the signals to be output in the stand-by mode are not determined. Thus, subthreshold leakage current in inverter circuits 30 and 32 can be reduced.

Third Embodiment

Figure 6:
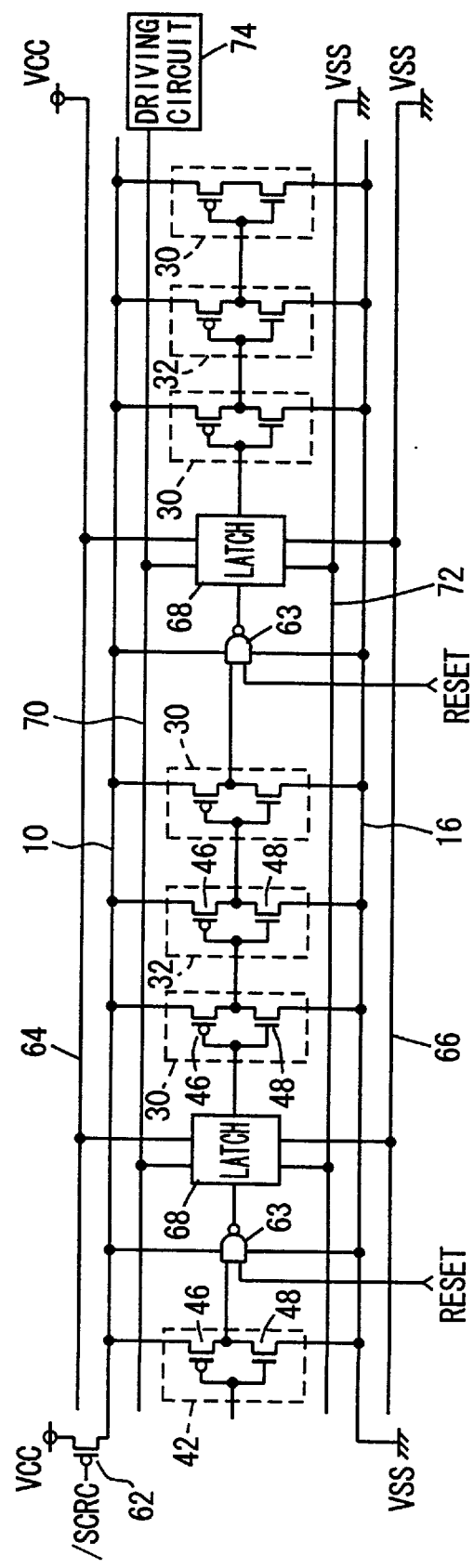
FIG. 6 is a circuit diagram showing a structure of a semiconductor circuit device according to a third embodiment of the present invention.

Referring to FIG. 6, a semiconductor circuit device includes a P channel MOS transistor 62 connected between a node receiving a power supply voltage VCC and a main power supply line 10 unlike the structures shown in FIGS. 1 and 4. Transistor 62 is turned on and off in response to control signals/SCRC at L and H levels in operation and stand-by modes, respectively.

The semiconductor circuit device further includes an NAND circuit 63. The semiconductor circuit device does not include sub power supply and ground lines 12 and 18 as shown in FIGS. 1 and 4. Thus, each of logic circuits such as inverter circuits 30, 32, 42 and NAND circuit 63 is connected between main power supply and ground lines 10 and 16.

The semiconductor circuit device further includes a latch circuit 68 in place of latch circuit 44 shown in FIGS. 1 and 4. The semiconductor circuit device further includes: a latch fixed power supply line 64 always receiving power supply voltage VCC; a latch fixed ground line 66 always receiving a ground voltage VSS; a latch driving power supply line 70; a latch driving ground line 72; and a driving circuit 74 connected to latch driving power supply line 70.

Each of latch circuits 68 is connected between latch fixed power supply and ground lines 64 and 66 rather than between main power supply and ground lines 10 and 16. Thus, latch circuit 68 can latch a signal even in the stand-by mode.

Driving circuit 74 supplies power supply voltage VCC and ground voltage VSS for latch driving power supply line 70 in the operation and stand-by modes, respectively. In the present embodiment, latch driving ground line 72 is always supplied with ground voltage VSS.

Figure 7:
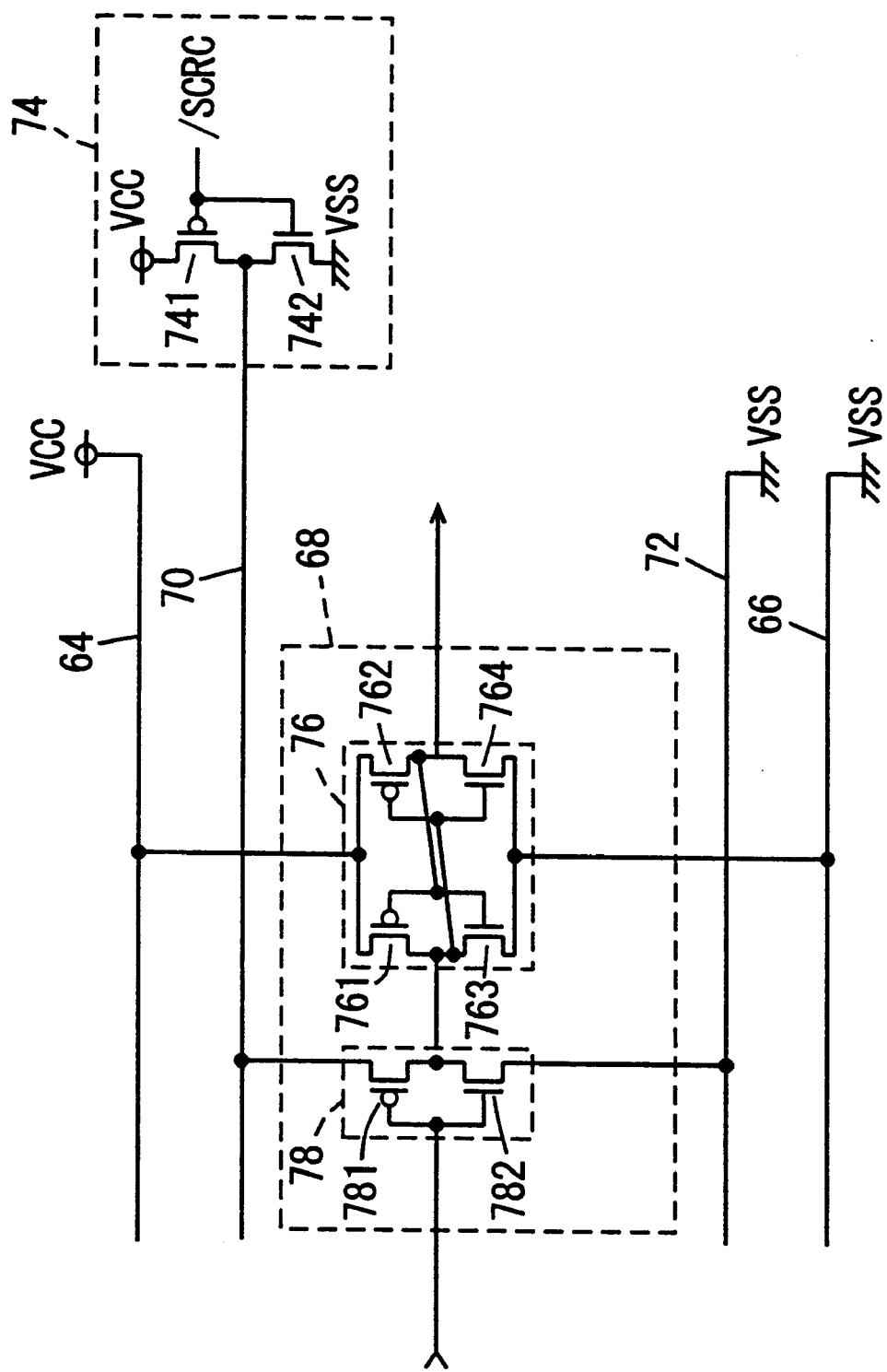
FIG. 7 is a circuit diagram showing structures of a latch circuit and a driving circuit shown in FIG. 6.

FIG. 7 is a circuit diagram showing structures of latch circuit 68 and driving circuit 74. Referring to FIG. 7, latch circuit 68 includes a latch circuit 76 including two CMOS inverter circuits which are mutually connected, and a CMOS inverter circuit 78. Latch circuit 76 includes P channel MOS transistors 761 and 762, and N channel MOS transistors 763 and 764. Transistors 761 and 763 form one CMOS inverter circuit, and transistors 762 and 764 form another CMOS inverter circuit. Latch circuit 76 is connected between latch fixed power supply and ground lines 64 and 66.

Inverter circuit 78 includes P channel and N channel MOS transistors 781 and 782. Inverter circuit 78 is connected between latch driving power supply and ground lines 70 and 72, and arranged on a signal input path to latch circuit 76. Thus, latch circuit 68, and more specifically inverter circuit 78, is driven by a potential difference between latch driving power supply and ground lines 70 and 72. An output signal from NAND circuit 63 is input to latch circuit 76 through inverter circuit 78.

Driving circuit 74 supplies power supply voltage VCC and ground voltage VSS for latch driving a power supply line 70 in the operation and stand-by modes, respectively. Driving circuit 74 includes P and N channel MOS transistors 741 and 742. When control signal/SCRC attains to the L level in the operation mode, transistor 74 is turned on and power supply voltage VCC is supplied for latch driving power supply line 70. On the other hand, when control signal/SCRC attains to the H level in the stand-by mode, transistor 742 is turned on and ground voltage VSS is supplied for latch driving power supply line 70.

Now, an operation of the semiconductor circuit device having the above described structure will be described.

In the operation mode, control signal/SCRC attains to the L level, so that transistor 62 is turned on and power supply voltage VCC is supplied for main power supply line 10. At the same time, transistor 741 is turned on and power supply voltage VCC is supplied for latch driving power supply line 70. As latch fixed power supply line 64 is always supplied with power supply voltage VCC, and main ground line 16, latch fixed ground line 66 and latch driving ground line 72 are always supplied with ground voltage VSS, normal operation of the semiconductor circuit device is ensured.

On the other hand, in the stand-by mode, control signal/SCRC attains to the H level, so that transistor 62 is turned off. Thus, inverter circuits 30, 32, 42 and NAND circuit 63 do not operate, and subthreshold leakage current for these circuits can be reduced.

However, as latch fixed power supply line 64 is always supplied with power supply voltage VCC, operation of latch circuit 76 is ensured. Thus, latch circuit 76 can continue to latch a signal at the logic level which has been latched immediately before the semiconductor circuit device enters the stand-by mode even in the stand-by mode. Accordingly, although a power supply source for inverter circuits 30, 32, 42 and NAND circuit 63 is completely turned off, when the semiconductor circuit device is brought back to the operation mode, the state immediately before the device entered the stand-by mode is obtained.

As the power supply source for NAND circuit 63 is turned off in the stand-by mode as described above, a signal at a random logic level may be input to latch circuit 68. In the stand-by mode, however, as ground voltage VSS is supplied for latch driving power supply line 70 from driving circuit 74, both of transistors 781 and 782 are turned off. Thus, in the stand-by mode, an input to latch circuit 76 is blocked, and a random signal would not be latched by latch circuit 76.

As described above, according to the third embodiment, a signal input to latch circuit 76 is blocked in the stand-by mode, even when the power supply source for inverter circuits 30, 32, 42 and NAND circuit 63 is turned off, it is ensured that latch circuit 76 continues to latch the signal at the logic level which has been latched immediately before the semiconductor circuit device entered the stand-by mode even in the stand-by mode.

In the third embodiment, driving circuit 74 supplies ground voltage VSS for latch driving power supply line 70 in the stand-by mode. Alternatively, a driving circuit supplying a voltage which is lower than ground voltage VSS for latch driving power supply line 70 may be provided. Further, although latch driving ground line 72 is always supplied with ground voltage VSS, a driving circuit which supplies ground voltage VSS for latch driving ground line 72 in the operation mode and supplies a voltage (for example power supply voltage VCC) which is higher than ground voltage VSS for latch driving ground line 72 in the stand-by mode may be provided. Such driving circuit allows transistor 782 to be more completely turned off in the stand-by mode.

In the third embodiment, inverter circuit 78 is provided for blocking the signal input to latch circuit 76 in the stand-by mode. Alternatively, a tristate buffer may be provided through the number of transistors increases.

Fourth Embodiment

Figure 8:
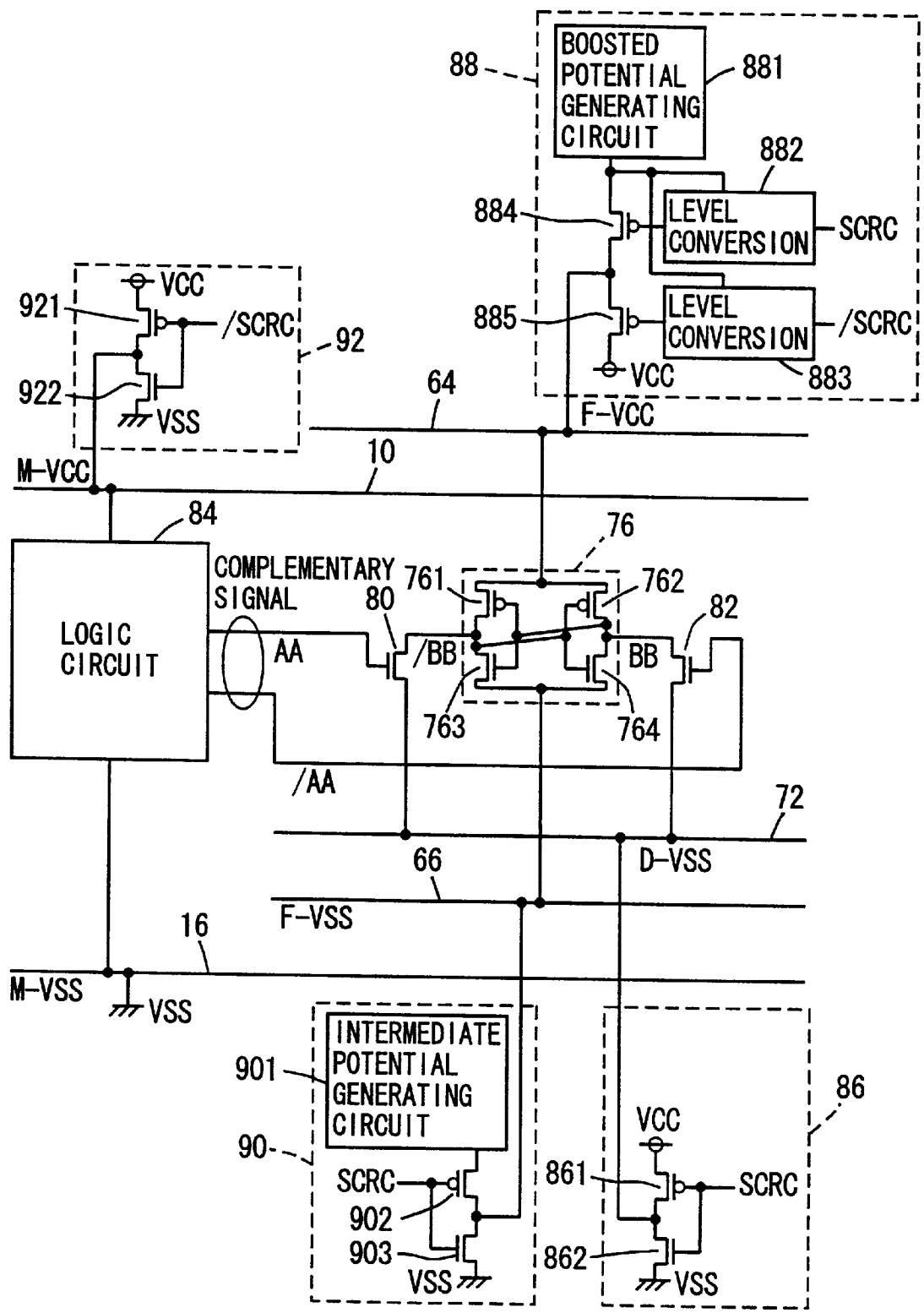
FIG. 8 is a circuit diagram showing a structure of a semiconductor circuit device according to a fourth embodiment of the present invention.

A latch circuit shown in FIG. 8 may be used in place of the latch circuit shown in FIG. 7. A semiconductor circuit device according to a fourth embodiment includes N channel MOS transistors 80 and 82 in addition to latch circuit 76. Transistor 80 is connected between one of input nodes of latch circuit 76 and a latch driving ground line 72 and having its gate receiving a signal AA. Transistor 82 is connected between the other of the input nodes of latch circuit 76 and latch driving ground line 72 and having its gate receiving a signal/AA which is complementary to signal AA. Signals AA and /AA are supplied from a logic circuit 84 connected between main power supply line 10 and main ground line 16.

The semiconductor circuit device further includes: a driving circuit 86 driving latch driving ground line 72; a driving circuit 88 driving a latch fixed power supply line 64; a driving circuit 90 driving a latch fixed ground line 66; and a driving circuit 92 driving a main power supply line 10.

Driving circuit 86 includes P and N channel MOS transistors 861 and 862 and supplies ground voltage VSS and a voltage (which is herein a power supply voltage VCC) which is higher than ground voltage VSS for latch driving ground line 72 in operation and stand-by modes when a control signal SCRC attains to the H and L levels, respectively.

Driving circuit 88 includes a boosted potential generating circuit 881, level converting circuits 882 and 833, and P channel MOS transistors 884 and 885. Boosted potential generating circuit 881 generates a voltage VPP which is higher than power supply voltage VCC. Level converting circuit 882 converts a logic level changing between power supply voltage VCC and ground voltage VSS to that changing between voltage VPP and power supply voltage VCC. Similarly, level converting circuit 883 converts a logic level of control signal/SCRC. Thus, driving circuit 88 supplies power supply voltage VCC for latch fixed power supply line 64 in the operation mode when control signals SCRC and/SCRC respectively attain to the H and L levels, and supplies voltage VPP which is higher than power supply voltage VCC for latch fixed power supply line 64 in the stand-by mode when control signals SCRC and/SCRC respectively attain to the L and H levels.

Driving circuit 90 includes an intermediate potential generating circuit 901 and P and N channel MOS transistors 902 and 903. Intermediate potential generating circuit 901 generates an intermediate voltage VCC/2. Thus, driving circuit 90 supplies ground voltage VSS for latch fixed ground line 66 in the operation mode when control signal SCRC attains to the H level, and supplies a voltage (which is herein intermediate voltage VCC/2) which is higher than ground voltage VSS for latch fixed ground line 66 in the stand-by mode when control signal SCRC attains to the L level.

Driving circuit 92 includes P and N channel MOS transistors 921 and 922, and supplies power supply voltage VCC and ground voltage VSS for main power supply line 10 in the operation and stand-by modes when control signal/SCRC attains to the L and H levels, respectively.

Now, an operation of the semiconductor circuit device having the above described structure will be described with reference to timing diagram in FIG. 9.

In the operation mode, a voltage M-VCC of main power supply line 10 attains to power supply voltage VCC. A voltage F-VCC of latch fixed power supply line 64 also attains to power supply voltage VCC. Voltage F-VSS of latch fixed ground line 66 attains to ground voltage VSS. Voltage D-VSS of latch driving ground line 72 also attains to ground voltage VSS. It is noted that voltage M-VSS of main ground line 16 is always ground voltage VSS.

Thus, normal operation of latch circuit 76 is ensured. More specifically, when a signal at the H level AA and a signal at the L level/AA are applied, transistors 80 and 82 are respectively turned on and off. Thus, ground voltage VSS from latch driving ground line 72 is input to latch circuit 76 as a signal at the L level/BB. Latch circuit 76 latches the signal and increases a level of signal BB to the H level. On the other hand, when signal at the L level AA and signal at the H level/AA are applied, transistors 80 and 82 are respectively turned off and on. Thus, ground voltage VSS from latch driving ground line 72 is input to latch circuit 76 as signal at the L level BB. Accordingly, latch circuit 76 latches the signal and increases the level of signal/BB to the H level.

On the other hand, in the stand-by mode, voltage M-VCC of main power supply line 10 attains to ground voltage VSS. Voltage F-VCC of latch fixed power supply line 64 attains to voltage VPP which is higher than power supply voltage VCC. Voltage F-VSS of latch fixed ground line 66 attains to an intermediate voltage VCC/2 which is higher than ground voltage VSS. Voltage D-VSS of latch driving ground line 72 attains to power supply voltage VCC.

Figure 9:
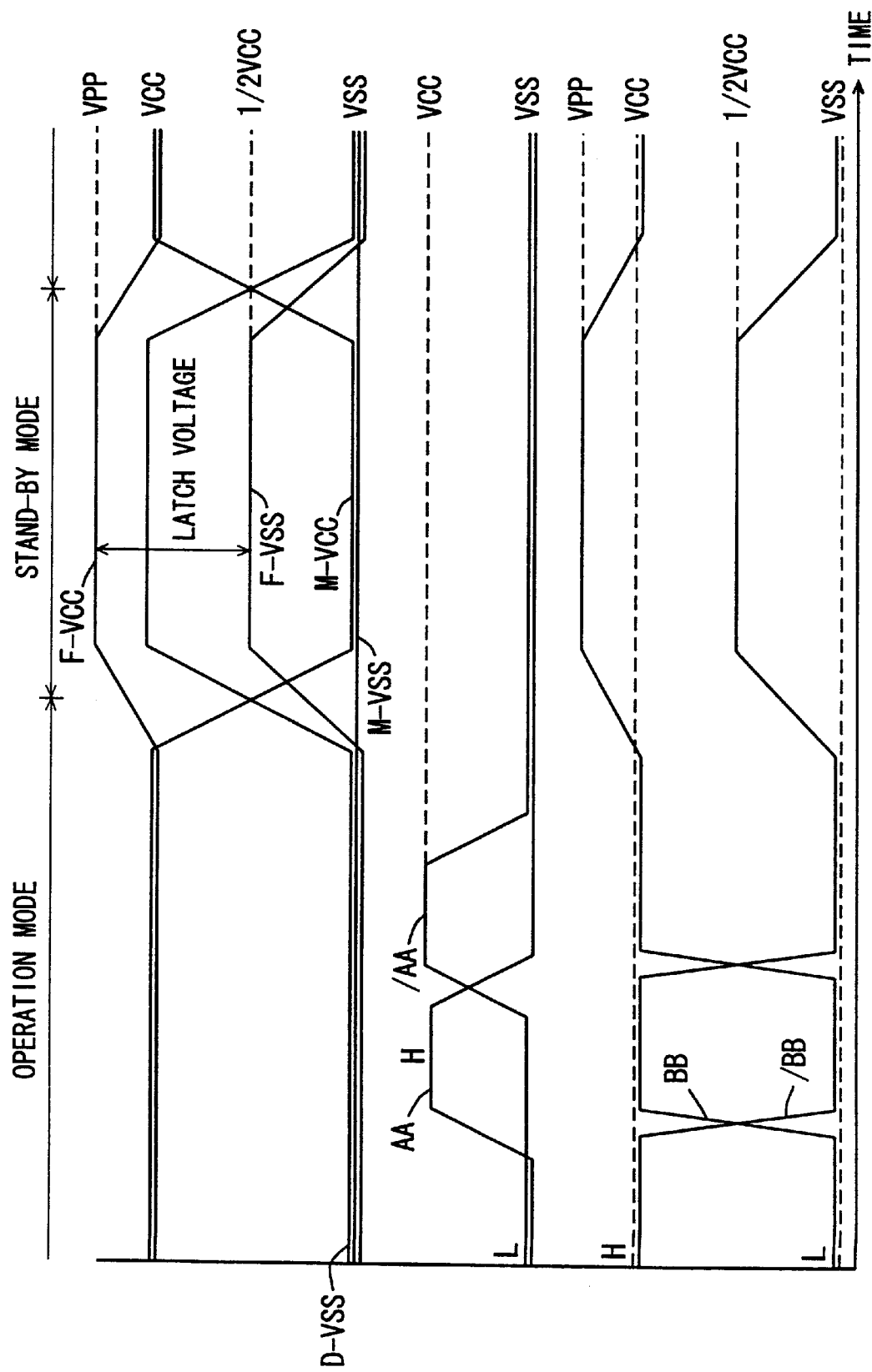
FIG. 9 is a timing diagram shown in conjunction with an operation of the semiconductor circuit device in FIG. 8.

Thus, when signals BB and/BB respectively attain to the L and H levels as shown in FIG. 9, drain and source voltages of transistor 82 respectively attain to intermediate voltage VCC/2 and power supply voltage VCC, so that a relatively negative bias is applied to a gate of transistor 82 and leakage current can be reduced as compared with the case where a zero bias is applied.

When signals BB and/BB respectively attain to the H and L levels, drain and source voltages of transistor 80 respectively attain to intermediate voltage VCC/2 and power supply voltage VCC, so that a relatively negative bias is also applied to a gate of transistor 80 and leakage current can be reduced as compared with the case where a zero bias is applied.

As described above, in the stand-by mode, the signal input to latch circuit 76 is blocked by transistors 80 and 82, so that a random signal would not be input to latch circuit 76.

In addition, in the stand-by mode, a potential difference between voltage VPP and intermediate voltage VCC/2 is applied to latch circuit 76, and therefore it is ensured that latch circuit 76 continues to latch a signal immediately before the semiconductor circuit device entered the stand-by mode.

In the circuit, desirably, threshold values of transistors 80 and 82 are set low and those of transistors 761 to 764 are set high. A voltage is always applied to latch circuit 76 to hold a signal, whereby leakage current is generated. The threshold values are set as described above in order to reduce the leakage current. For N channel MOS transistors 763 and 764, however, a transistor with a low threshold value can be employed. This is because when voltage F-VSS increases in the stand-by mode, a substrate bias is applied, the threshold value increases and leakage current is reduced. Similarly, for P channel MOS transistors 761 and 762, a transistor with a low threshold value can be employed if leakage current is reduced by driving a well voltage to a voltage which is higher than voltage VPP in the stand-by mode. Thus, the same threshold value can be used for all of P and N channel MOS transistors, so that steps of setting transistor channel profile for setting threshold values can be eliminated and a manufacturing process is simplified.

As described above, according to the fourth embodiment, transistors 80 and 82 are completely turned off in the stand-by mode, so that a random signal would not be input to latch circuit 76. In addition, as a prescribed voltage is supplied for latch circuit 76 in the stand-by mode, it is ensured that latch circuit 76 latches a signal.

It is noted that although voltage D-VSS of latch driving ground line 72 is power supply voltage VCC in the stand-by mode, the voltage needs only be higher than ground voltage VSS. Although voltage F-VSS is increased to intermediate voltage VCC/2, it may be increased to any voltage which allows transistors 80 and 82 to be turned off and reduction in leakage current to be achieved. Further, in the present embodiment, although a latch voltage is ensured and voltage F-VCC is increased to voltage VPP which is higher than power supply voltage VCC to maintain the latch signal in the stand-by mode, voltage F-VCC needs not be changed as long as the latch signal can be maintained.

Fifth Embodiment

Figure 10:
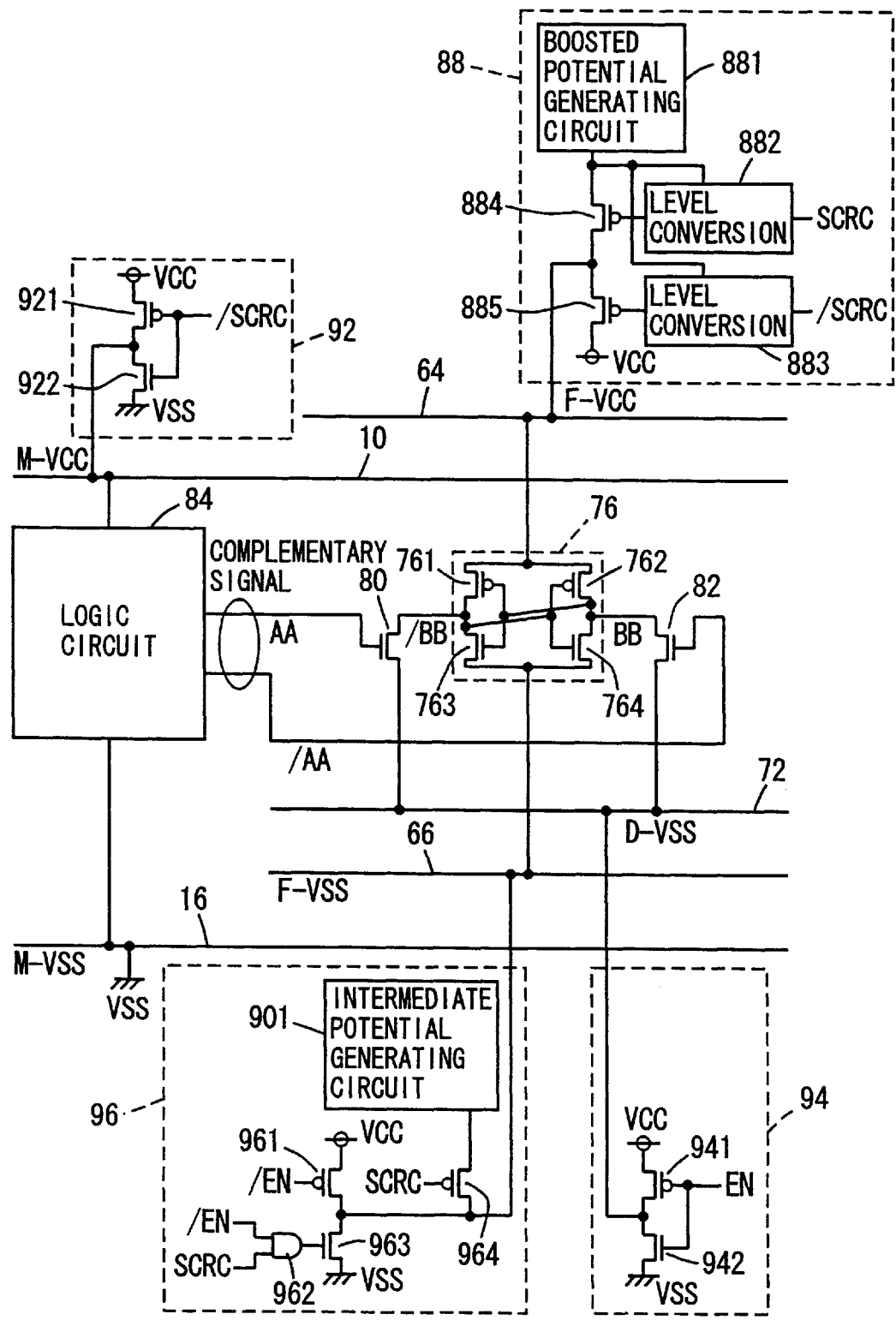
FIG. 10 is a circuit diagram showing a structure of a semiconductor circuit device according to a fifth embodiment of the present invention.

Driving circuits 94 and 96 shown in FIG. 10 may be provided in place of driving circuits 86 and 90 shown in FIG. 5.

Driving circuit 94 includes P and N channel MOS transistors 941 and 942. Enable signals EN are applied to gates of transistors 941 and 942. A signal for activating a sense amplifier in an SDRAM (Synchronous Dynamic Random Access Memory) which will later be described may be used as enable signal EN. Thus, as shown by a voltage D-VSS in FIG. 11, driving circuit 94 temporarily supplies a ground voltage VSS for a latch driving ground line 72 when inputting signals AA and/AA in an operation mode, and otherwise supplies a power supply voltage VCC for latch driving ground line 72.

Driving circuit 96 includes a P channel MOS transistor 961, an AND circuit 962, an N channel MOS transistor 963, an intermediate potential generating circuit 901 and a P channel MOS transistor 964. An enable signal/EN is applied to a gate of transistor 961. AND circuit 962 receives enable signal/EN and a control signal SCRC and applies an output signal to a gate of transistor 963. Control signal SCRC is applied to a gate of transistor 964. Thus, as shown by a voltage F-VSS in FIG. 11, driving circuit 96 temporarily supplies power supply voltage VCC for a latch fixed ground line when inputting signals AA and/AA in the operation mode in which control signal SCRC attains to an H level, and otherwise supplies ground voltage VSS for a latch fixed ground line 66. Driving circuit 96 supplies a voltage (which is herein an intermediate voltage VCC/2) which is higher than a ground voltage for latch fixed ground line 66 in a stand-by mode in which control signal SCRC attains to an L level.

Now, an operation of the semiconductor circuit device having the above described structure will be described with reference to a timing diagram in FIG. 11.

As the operation of the semiconductor circuit device in the stand-by mode is the same as that of the fourth embodiment shown in FIGS. 8 and 9, only the operation in the operation mode will be described.

Figure 11:
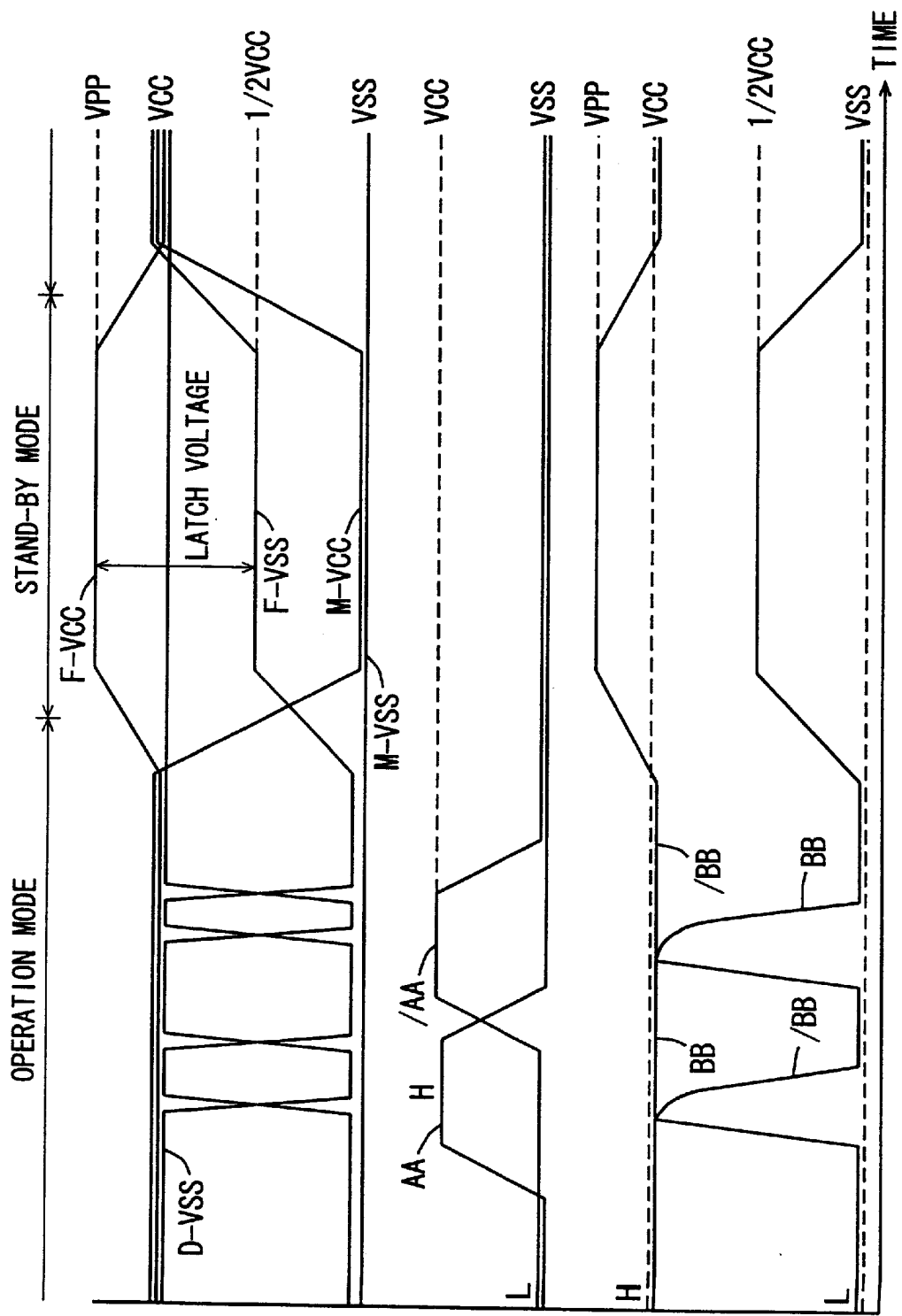
FIG. 11 is a timing diagram shown in conjunction with an operation of the semiconductor circuit device in FIG. 10.

In the fifth embodiment, as shown in FIG. 11, a voltage of latch driving ground line 72 is in principle power supply voltage VCC also in the operation mode. Thus, transistors 80 and 82 are turned off, and a random signal would not be input to latch circuit 76. However, voltage D-VSS temporarily attains to ground voltage VSS when signals AA and/AA are applied. When voltage D-VSS of latch driving ground line 72 attains to ground voltage VSS, signals BB and/BB are input to latch circuit 76 in response to signals AA and/AA.

As soon as voltage D-VSS of latch driving ground line 72 attains to ground voltage VSS, voltage F-VSS of latch fixed ground line 66 attains to power supply voltage VCC, and therefore both of signals BB and/BB are first at power supply voltage VCC. However, as soon voltage D-VSS attains to power supply voltage VCC, voltage F-VSS attains to ground voltage VSS, so that a potential difference between both input nodes is amplified in response to signals BB and/BB. When signals AA and/AA are respectively at the H and L levels, the levels of signals BB and/BB are maintained at power supply voltage VCC and ground voltage VSS, respectively. On the other hand, when signals AA and/AA are respectively at the L and H levels, the levels of signals BB and/BB are maintained at ground voltage VSS and power supply voltage VCC, respectively.

As described above, according to the fifth embodiment, as voltage D-VSS of latch driving ground line 72 and voltage F-VSS of latch fixed ground line 66 vary between power supply voltage VCC and ground voltage VSS in synchronization with input of signals AA and/AA, latch circuit 76 performs an amplification function. As a result, it is ensured that latch circuit 76 latches a signal immediately before the semiconductor circuit device entered the stand-by mode.

It is noted that an external power supply voltage or an internal power supply voltage which is lower than the external power supply voltage may be used as power supply voltage VCC in each of the above described first to fifth embodiments unless otherwise specified. Similarly, an external ground voltage or an internal ground voltage which is higher than the external ground voltage may be used as ground voltage VSS unless otherwise specified.

Further, in the fifth embodiment, voltages F-VSS and G-VSS perform complementary operations in the operation mode. However, such complementary operations are by way of example and can be changed in accordance with a required specification. If a margin for an amplification operation of input signals AA and/AA by transistors 80 and 82 is to be increased, ground voltage VSS may be maintained for a certain period of time after voltage F-VSS is changed to ground voltage VSS. The most important point is that latch circuit 76 amplifying input signals AA and/AA dynamically operates.

Sixth Embodiment

Figure 12:
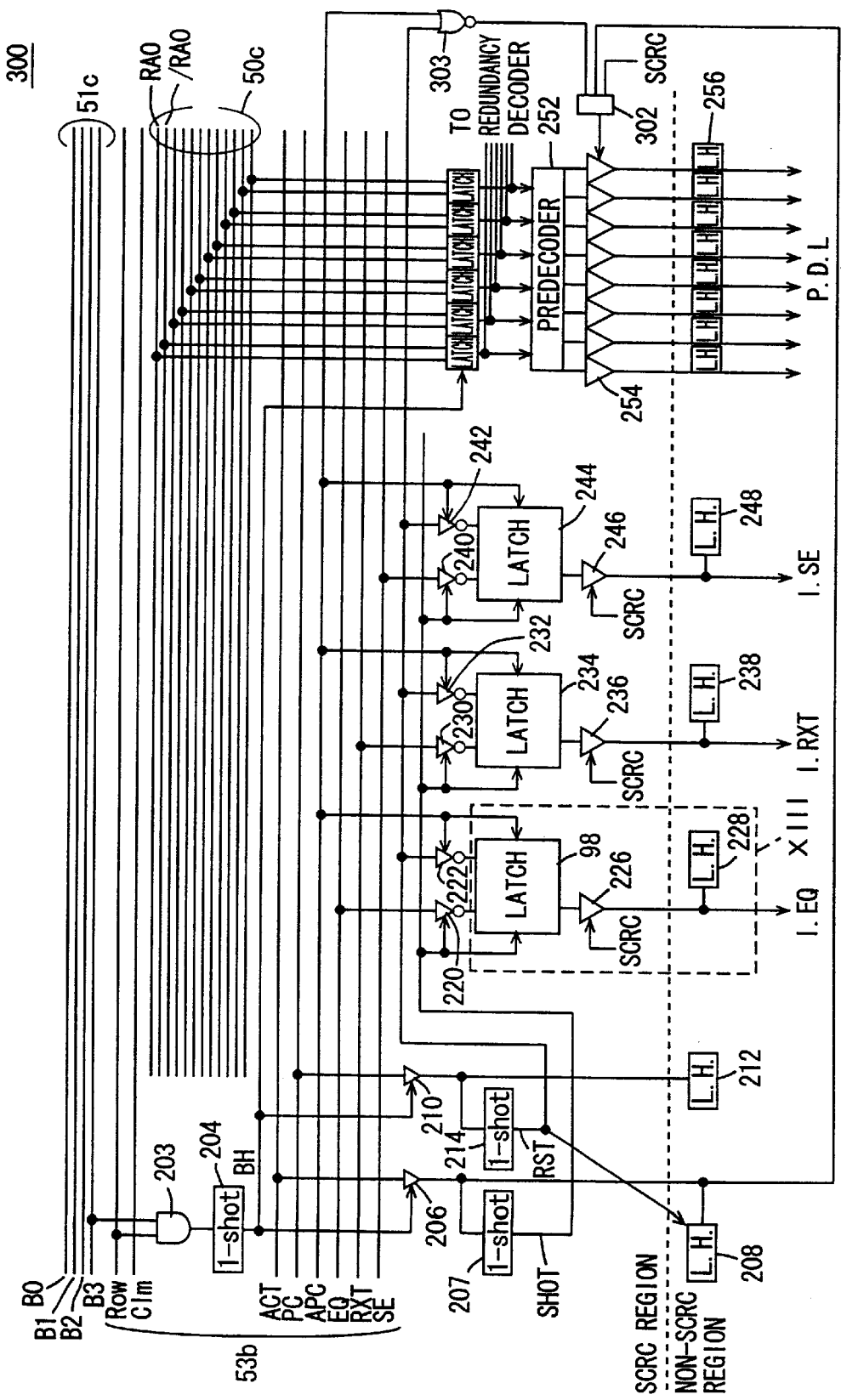
FIG. 12 is a block diagram showing a structure of a row predecoder in an SDRAM according to a sixth embodiment of the present invention.
Figure 13:
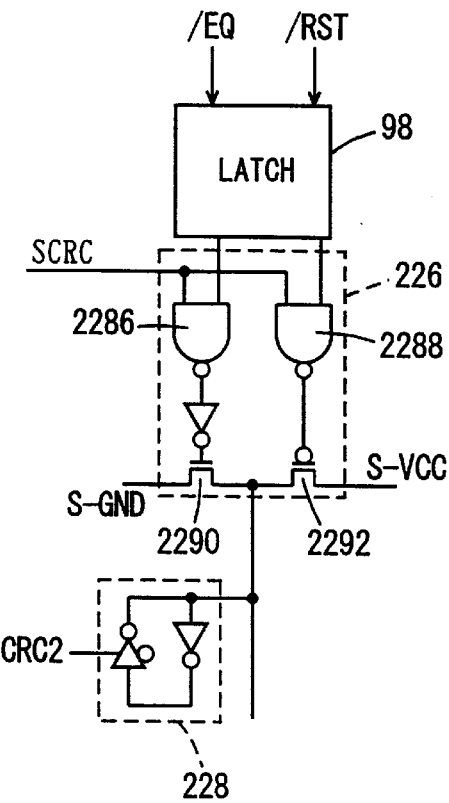
FIG. 13 is a circuit diagram showing in detail a structure of a circuit portion XIII shown in FIG. 12.
Figure 14:
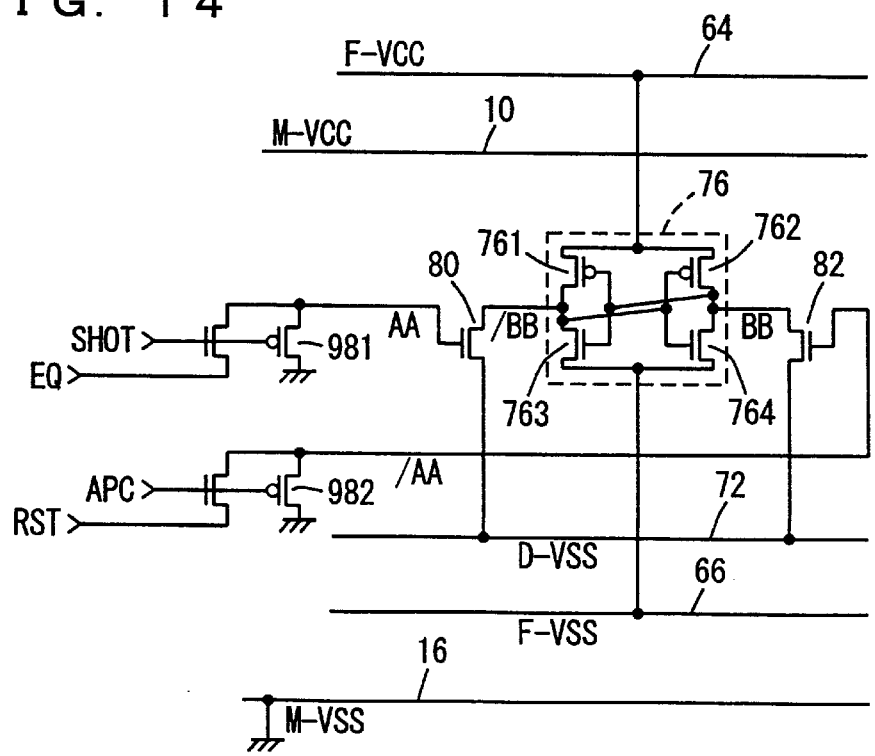
FIG. 14 is a circuit diagram showing a structure of a latch circuit shown in FIG. 13.

The latch circuits according to the fourth and fifth embodiments shown in FIGS. 8 and 10 may be used, for example, for a row predecoder of an SDRAM. More specifically, as shown in FIGS. 12 and 13, a latch circuit 98 for latching row related address signals ACT, PC, APC, EQ, RXQ and SE is structured as shown in FIG. 14. The same applies to the other latch circuits 234 and 244. As shown in FIG. 14, in latch circuit 98, P channel MOS transistors 981 and 982 are connected to gates of transistors 80 and 82, respectively. A one shot pulse signal SHOT which is generated upon activation of signal ACT by a one shot pulse generating circuit 207 is applied to the gate of transistor 981. Signal APC which is generated as a one shot pulse at the time of reset is applied to the gate of transistor 982. Accordingly, gate voltages of transistors 80 and 82 attain to ground voltage VSS when signals EQ and RST are not input.

Figure 15:
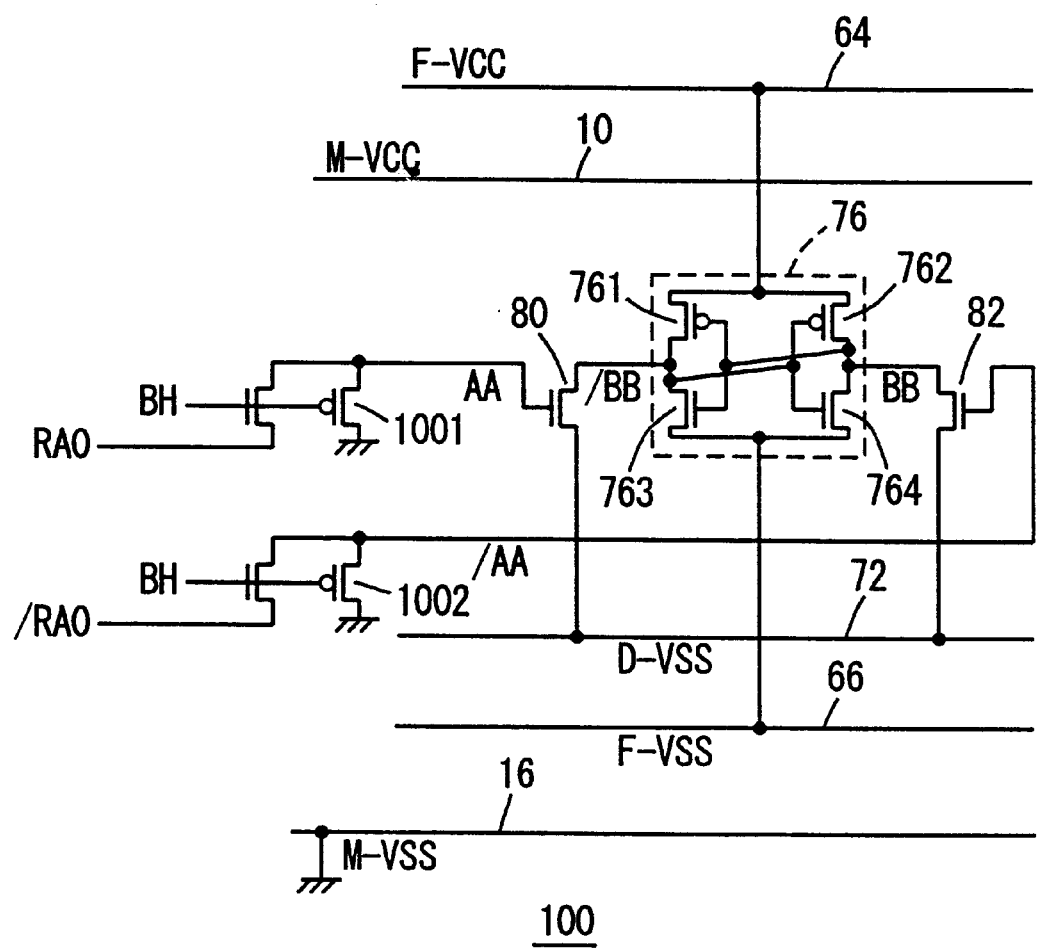
FIG. 15 is a circuit diagram showing a structure of a latch circuit receiving an address signal shown in FIG. 12.

A latch circuit 100 (shown in FIG. 12) latching a row related address signal is structured as shown in FIG. 15. P channel MOS transistors 1001 and 1002 are respectively connected to gates of transistors 80 and 82 also in latch circuit 100. A bank hit signal BH generated by a one shot pulse generating circuit 204 is applied to the gates of transistors 1001 and 1002. Thus, gate voltages of transistors 80 and 82 attain to a ground voltage VSS when row address signals RA and/RA are not input.

As described above, according to the sixth embodiment, latch circuit 98 is structured as shown in FIG. 14. As a result, after latch circuit 98 latches a command signal, it continues to latch the command signal even when a power supply source is turned off, and it can output the latch command signal when the power supply source is again turned on.

Further, as latch circuit 100 is structured as shown in FIG. 15, after latching an address signal, latch circuit 100 continues to latch the address signal even if the power supply source is turned off. Then, if the power supply source is again turned on, latch circuit 100 can output the latch address signal.

Detailed Description of SDRAM and Row Predecoder

The SDRAM and row predecoder for which the latch circuits according to the fourth and fifth embodiments are used will now be described in detail for reference.

Figure 20:
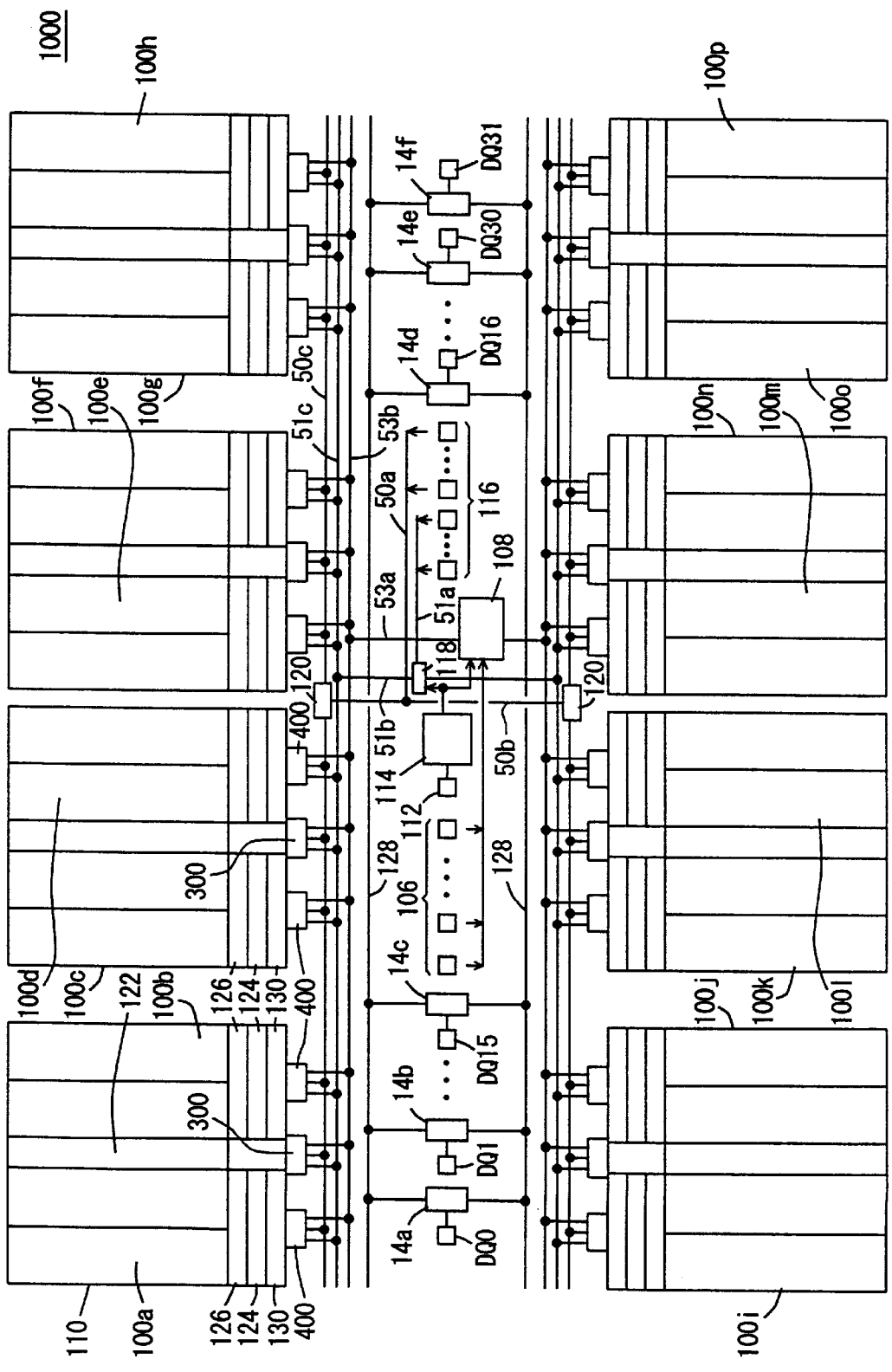
FIG. 20 is a block diagram showing an overall structure of the SDRAM including the row predecoder shown in FIG. 12 and the column predecoder shown in FIG. 17.

FIG. 20 is a schematic block diagram showing an overall structure of the SDRAM. Referring to FIG. 20, an SDRAM 1000 includes: a control circuit 108 receiving and decoding external control signals/RAS,/CAS,/W,/CS or the like which are applied through an external control signal input terminal group 106 for generating internal control signals; command data buses 53a and 53b transmitting the internal control signals output from control circuit 108; and a memory cell array 110 having memory cells arranged in a matrix.

As shown in FIG. 20, memory cell array 110 is divided into sixteen memory cell blocks 100a to 100p in total. If SDRAM 1000 has a storage capacity of 1-G bit, for example, each of the memory cell blocks has a storage capacity of 64-M bit. Each block is capable of independently operate as a bank.

SDRAM 1000 further includes an internal synchronization signal generating circuit 114 receiving an external clock signal Ext.CLK applied to a clock signal input terminal 12 for starting a synchronization operation under control of control circuit 114 and outputting an internal clock signal int.CLK.

Internal synchronization signal generating circuit 114 generates internal clock signal int.CLK in synchronization with external clock signal Ext.CLK by a delay locked loop circuit (which is hereinafter abbreviated as a DLL circuit) or the like.

External address signals A0 to Ai (i: natural number) applied through an address signal input terminal group 116 are received by SDRAM 1000 in synchronization with internal clock signal int.CLK under control of control circuit 108.

A data having a prescribed number of bits of external address signals A0 to Ai is applied to a bank decoder 22 through an address bus 51a. Bank addresses B0 to B7 which have been decoded are transmitted to each bank through address buses 51b and 51c from bank decoder 118.

On the other hand, the other external address signals applied to address signal input terminal group 116 is transmitted to an address driver 120 through address buses 50a and 50b. The address signal is transmitted to each bank (memory cell block) through address bus 50c from address driver 120.

SDRAM 1000 further includes: a row predecoder 300 provided for each pair of memory cell blocks for latching and predecoding a row address which has been transmitted from address bus 50c under control of control circuit 108; a row decoder 122 selecting a corresponding column (a word line) of a memory cell block which has been selected in accordance with an output from row predecoder 300; a column predecoder 400 provided for each memory cell block for latching and predecoding a column address which has been transmitted from address bus 50c under control of control circuit 108; a column predecoder line 124 transmitting an output from column predecoder 400; and a column decoder 126 selecting a corresponding column (a pair of bit lines) of a memory cell block which has been selected in accordance with an output from a column predecoder line 124.

SDRAM 1000 further includes: data input terminals DQ0 to DQ15 and DQ16 to DQ31 respectively arranged in regions outside external control signal input terminal group 106 and address signal input terminal group 116 within a region which extends along a longer side of the middle portion of a chip; input/output buffer circuits 14a to 14f respectively provided corresponding to data input/output terminals DQ0 to DQ31; a data bus 128 transmitting data between an input/output buffer and corresponding memory cell block; and a read/write amplifier 130 provided corresponding to memory cell blocks 100a to 100p for inputting and outputting data between data bus 128 and the selected memory cell column.

Signal/RAS applied to external control signal input terminal group 106 is a row address strobe signal which starts an internal operation of SDRAM 1000 and determines an activate period of the internal operation. Circuits associated with an operation of selecting a row of memory cell array 110 such as a row decoder 122 or the like is brought into an active state upon activation of signal/RAS.

Signal/CAS applied to external control signal input terminal group 106 is a column address strobe signal and brings a circuit selecting a row of memory cell array 110 into the active state.

Signal/CAS applied to external control signal input terminal group 106 is a chip select signal indicating that SDRAM 1000 is selected, and signal/W is a signal instructing a writing operation of SDRAM 1000.

Signals/CS,/RAS,/CAS and/W are received in synchronization with internal clock signal int.CLK.

In addition, receiving operation of the address signal applied to address signal input terminal group 116 and inputting/outputting of data through data input/output terminals DQ0 to DQ31 are also performed in synchronization with internal clock signal int.CLK.

FIG. 12 is a schematic block diagram showing a structure of a row predecoder 300 in an SDRAM.

A command bus 53b transmits signals Row and Clm respectively instructing activation of row and column related circuit operations, a signal ACT instructing activation of an operation of an internal circuit, a signal PC instructing reset (precharge) of a bank, a signal APC instructing precharge of all banks, a signal EQ instructing that equalization of a bit line or the like should be stopped and that an unused bit line should be disconnected from a sense amplifier, a signal RXT instructing activation of a word line, a signal SE instructing activation of a sense amplifier, or the like.

A bank address bus 51c transmits bank address signals B0 to B3 which have been decoded by a bank decoder. An address bus 50c transmits a row address signal from an address driver.

When a bit data B3 and signal Row of the bank address signals are brought into the active state, for example, a signal in the active state is output from an AND circuit 203 and, responsively, an active bank hit BH is output from a one shot pulse generating circuit 204.

Responsively, a driver circuit 206 is activated and, a level of signal ACT is received and held in a level holding circuit 208. On the other hand, one shot pulse generating circuit 207 receives an output from driver circuit 206 for outputting a one shot pulse signal SHOT.

Similarly, driver circuit 210 is activated in response to a bank hit signal BH from one shot pulse generating circuit 204, and level holding circuit 212 receives and holds a level of signal PC. On the other hand, one shot pulse generating circuit 214 receives an output from driver circuit 210 for outputting a reset signal RST for level holding circuit 208. An inverter 220 is activated in response to an output signal from level holding circuit 208 for receiving and outputting signal EQ. On the other hand, an inverter 222 is activated in response to signal APC for receiving a signal RST from one shot pulse generating circuit 214 and outputting an inverted signal thereof. Latch circuit 98 is set in accordance with an output from inverter 220 and reset in accordance with an output from inverter 222. A driver circuit 226 which is activated by a control signal SCRC receives and outputs an output from latch circuit 98, and level holding circuit 228 holds an output level of driver circuit 226. An output level of level holding circuit 228 is applied to a corresponding memory cell block as a signal l.EQ.

Similarly, latch circuit 234 is set and reset by outputs from inverters 230 and 232, respectively.

Driver circuit 236 receives an output from a latch circuit 234 and is activated by control signal SCRC. An output level of driver circuit 236 is held by level holding circuit 238, and an output level of level holding circuit 238 is output to a corresponding memory cell block as a signal l.RXT.

A latch circuit 244 is set and reset in accordance with outputs from inverters 240 and 242, respectively. Driver circuit 246 receives an output from latch circuit 244 and is activated by control signal SCRC. An output level of driver circuit 246 is held by level holding circuit 244, and an output level of level holding circuit 244 is applied to a corresponding memory cell block as a signal l.SE.

On the other hand, a latch circuit 100 is reset upon activation of control signal SCRC, and holds a row address signal which has been activated in accordance with a bank hit signal from one shot pulse generating circuit 204 and transmitted through address bus 50c. An output from latch circuit 100 is transmitted to a redundancy address decoder (not shown) and applied to a predecoder 252. A predecoded result is applied to a driver circuit 254.

Driver circuit 254 is activated by an output signal from a driver control circuit 302. Driver control circuit 302 is controlled by an output signal from an NAND circuit 303 receiving signals APC and RST, an output signal from level holding circuit 208 and control signal SCRC. Driver control circuit 302 maintains driver circuit 254 in an inactive state during the period in which signal ACT is active even if control signal SCRC is again brought into the active state when driver control circuit 302 is once activated and then inactivated. In other words, by controlling driver circuit 254 by such driver control circuit 302, after a row address is once received by level holding circuit 256, when control signal SCRC is again activated or the like, driver 254 is brought into the active state for preventing a predecoder address signal held by level holding circuit 256 from being reset. More specifically, after driver circuit 254 is once brought into the active state and then inactivated, when driver circuit 254 is brought into the active state as latch circuit 100 for receiving an address signal and predecoder 252 are reset, the predecode address signal held by level holding circuit 256 is prevented from being reset.

An output from driver circuit 254 is held by level holding circuit 256, which then outputs it to a corresponding row predecoder line.

A region including level holding circuits 208, 212, 228, 238, 248 and 256 and corresponding memory cell blocks is not controlled by a control signal and is a non-hierarchical power supply region which is always operated using a power supply voltage VCC and a ground voltage VSS as a power supply voltage both in the active and stand-by state.

The other region of row predecoder 300 is controlled by the control signal for receiving power supply voltage VCC and ground voltage VSS for operation when control signal SCRC is in the active state and receiving a potential which is lower than power supply voltage VCC and a voltage which is higher than ground voltage VSS as a power supply voltage for operation when control signal SCRC is at the L level.

The circuits included in the hierarchical power supply region allows decrease in subthreshold leakage current of an MOS transistor during normal stand-by when a bank is not activated.

On the other hand, the circuits included in the non-hierarchical power supply region, that is, level holding circuits 208, 212, 228, 238, 248 and 256 do not have hierarchical power supply structures as levels held thereby change in accordance with an operation state even during stand-by operation.

More specifically, in row predecoder 300 shown in FIG. 12, in order to perform an operation such as reading of data from a memory cell even when the chip is active, after a sufficient period of time for externally receiving data is elapsed, subthreshold current is reduced by the hierarchical power supply structure for the circuit other than the required portion.

Thus, driver circuits 226, 236 and 246 which operate in accordance with output levels of latch circuits 98, 234 and 244 are operated for the first period of time in which command levels thereof are transmitted for the circuits included in the hierarchical power supply region. After the command levels are held by level holding circuits 228 to 248, output levels of driver circuits 226 to 246 are brought into a floating state because of its tristate structure. More specifically, even when a circuit system which precedes driver circuits 226 to 246 in position is brought into a state in which subthreshold current is reduced by the hierarchical power supply structure, a state of a command for operation which is output for a corresponding memory cell block (a bank) is held by level holding circuits 228 to 248.

Similarly, after an address data received from address bus 50c is received by latch circuit 100 and a process for propagating it to a corresponding memory cell block is performed in predecoder 252, it is driven for a given period of time in driver circuit 254. Subsequently, even when driver circuit 254 having a tristate structure is brought into a state in which it is operated by a voltage which is lower than power supply voltage VCC and by a voltage which is higher than ground voltage VSS in accordance with inactivation of control signal SCRC, an output from driver circuit 254 is in the floating state.

A level of a predecode signal which is driven by driver circuit 254 is held by level holding circuit 256. The above described structure ensures that a state of a predecode address signal output for the memory cell array is maintained even when the circuit system which is on the side upper than driver circuit 254 is reset such that subthreshold current of an MOS transistor forming the circuit system is reduced by the hierarchical power supply structure.

FIG. 13 is a schematic block diagram showing structures of latch circuit 98, driver circuit 226 and level holding circuit 228 shown in FIG. 12.

Driver circuit 226 includes: an NAND circuit 2286 having its one input node receiving a control signal SCRC and the other input node receiving one output signal from latch circuit 98; an NAND circuit 2288 having its one input node receiving control signal SCRC and the other input node receiving the other output from latch circuit 224; an N channel MOS transistor 2290 having its gate potential controlled by an output from NAND circuit 2286 and its source receiving a hierarchical power supply voltage S-GND (a voltage of a sub ground line); and a P channel MOS transistor 2292 having its gate receiving an output from NAND circuit 2288 and its source receiving a hierarchical power supply voltage S-VCC (a voltage of a sub power supply line). Drains of N and P channel MOS transistors 2290 and 2292 are connected, and a potential level of the connection node is an output potential of driver circuit 226.

Level holding circuit 228 is a latch circuit which is activated by a control signal SCRC2. Control signal SCRC2 is activated simultaneously with control signal SCRC, and inactivated in response to inactivation of control signal SCRC at a time t6 shown in FIG. 16, which will later be described.

Figure 16:
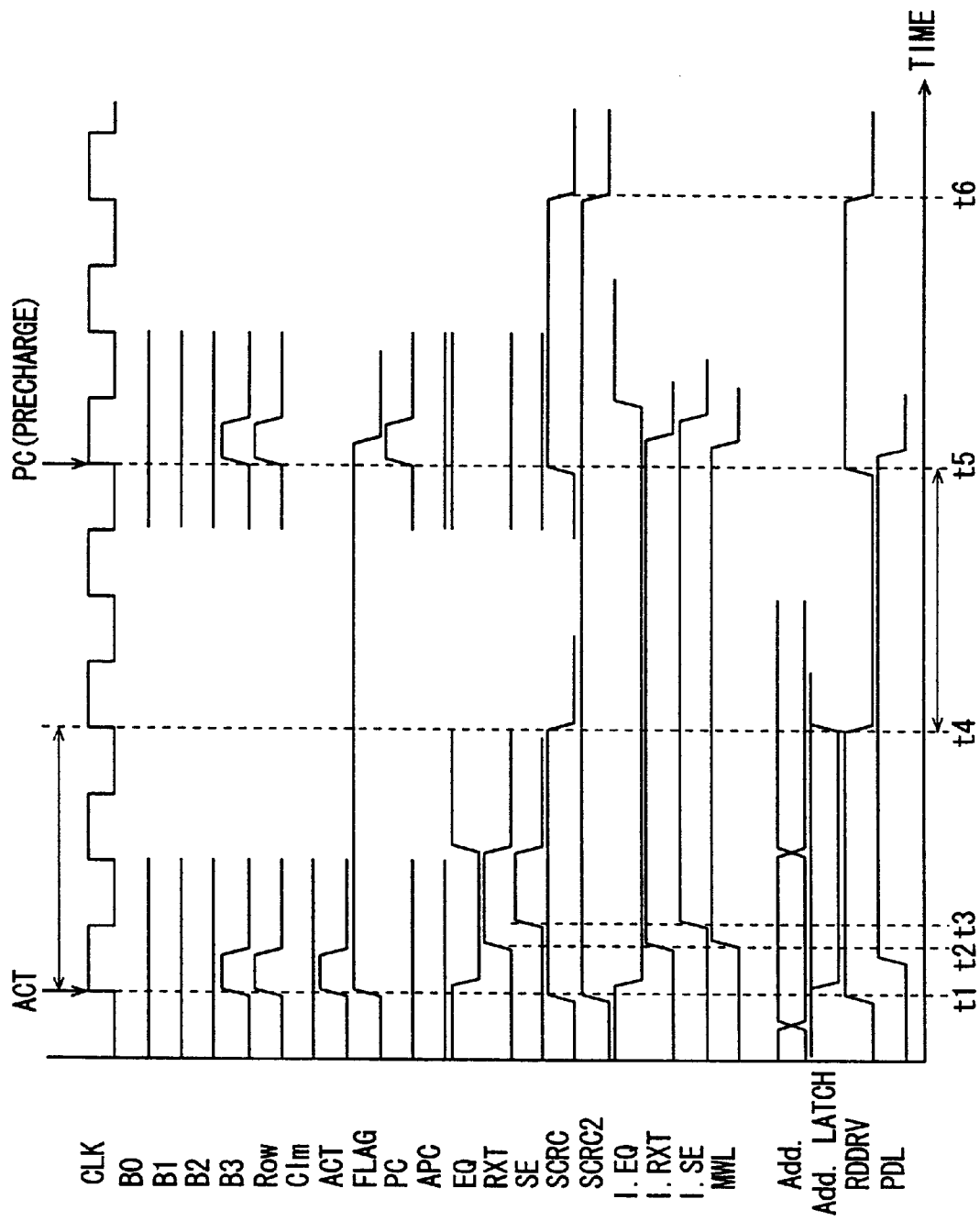
FIG. 16 is a timing diagram showing in conjunction with an operation of the SDRAM shown in FIG. 12.

FIG. 16 is a timing chart shown in conjunction with an operation of a predecode circuit 300 shown in FIG. 12.

Referring to FIG. 16, signals B0 to B3 are signals indicating bank addresses, a signal Row is a row related access identification signal instructing activation of a row related circuit operation, a signal Clm is a column related access identification signal instructing activation of a column related circuit operation and a signal ACT is a bank activation signal.

Further, a flag signal is a signal which is held by level holding circuit 208 in response to the fact that a bank is accessed (a bank is hit), a signal PC is a precharge signal instructing a precharge operation of the selected bank, and a signal APC is an all bank precharge signal instructing a precharge operation of all banks.

A signal l.EQ is a local bit line equalize signal which is held by level holding circuit 228, a signal l.RXT is a local word line activation signal which is held by level holding circuit 238, a signal l.SE is a local sense amplifier activation signal which is held by level holding circuit 248, and a potential MWL is a potential level of a main word line in a memory cell block (a bank).

A signal Add. is an address signal which is held by level holding circuit 256.

An operation will now be described.

At a rising edge of a clock signal CLK at a time t1, bit B3 of the decoded bank address is in the active state, and a corresponding bank is selected. At the time, as signal Row is also in the active state, an active one shot pulse is responsively output from one shot pulse generating circuit 204. Responsively, signal ACT in the active state which has been transmitted by a command bus 53b is driven by driver circuit 206, and a level of active signal ACT is held by level holding circuit 208 as a flag signal.

In response to activation of the flag signal, a level of signal EQ which has been transmitted by command bus 53b is held by latch circuit 98.

At time t1, control signal SCRC also attains to the H level, and all of the circuits in the hierarchical power supply region receive power supply voltage VCC and ground voltage VSS for operation.

The level of signal EQ which has been received by latch circuit 98 is driven by driver circuit 226 and held by level holding circuit 228 as an internal equalize signal l.EQ.

Control signal SCRC2 is a signal for resetting level holding circuits 228, 238 and 248, and a signal RDDRV is a signal for controlling an operation of driver circuit 254. At the time t1, in response to the fact that bank address signal B3 and signal Row are in the active state, a level of signal ACT which is in the active state is received by level holding circuit 208 by command bus 53b, and a level of a flag output from level holding circuit 208 is changed to the H level. Responsively, driver control signal RDDRV output from driver control circuit 302 attains to the H level. In addition, control signals SCRC and SCRC2 are brought into the active state.

At a time t2, a signal RXT which is transmitted by command bus 53b is brought into the active state and a level thereof is received by latch circuit 234. Responsively, level holding circuit 238 maintains the level of internal word line activation signal l.RXT in the active state.

Thereafter, at a time t3, a level of a signal SE which has been transmitted by command bus 53b is brought into the active state, and the level is received by a latch circuit 244. Responsively, level holding circuit 248 maintains a level of an internal sense amplifier activation signal l.SE in the active state.

In response to the activation of internal word line activation signal l.RXT, a potential level of a main word line in a row which has been selected is changed to the H level.

An address signal which has been transmitted through address bus 50c is latched by latch circuit 100, predecoded by a predecoder 252 and driven by driver 254. A level of a row predecoder line PDL is driven to a corresponding level. At a time t4, control signal SCRC attains to be L level by predecoder 252 in accordance with the level of row predecoder line PDL. Signal RDDRV also attains to the L level at time t4.

In other words, a period between t1 and t2 corresponds to a period which is required for operation of the circuits in one bank.

When control signal SCRC is brought into the inactive state, the circuits included in the hierarchical power supply region enter a mode which allows decrease in leakage current.

On the other hand, internal equalize signal l.EQ, internal word line activation signal l.RXT and internal sense amplifier activation signal l.SE which are respectively output from level holding circuits 228, 238 and 248 maintain the levels thereof.

At a rising edge of clock signal CLK at a time t5, bank signal B3 and signal Row are brought into an activation state and precharge signal PC is brought into the active state. Thus, inverters 222, 232 and 242 receive a level of signal PC input through driver circuit 210 and driven by signals output from one shot pulse generating circuit 214, and levels of latch circuits 98, 234 and 244 are reset.

On the other hand, control signal SCRC is also brought into the active state at time t5, signals l.EQ, l.RXT and l.SE responsively reset levels thereof. In addition, the level held by latch circuit 100 is also reset in response to activation of control signal SCRC and, responsively, a level of row predecode line PDL is reset.

More specifically, in a period between t4 and t5, although the circuits included in the hierarchical power supply region is reset to reduce leakage current, signals l.EQ, l.RXT, l.SE and the level of row predecoder line PDL all maintain levels thereof.

Using the above described structure, an address bus is shared by banks which independently operate, so that an area occupied by the address bus can be reduced.

When a prescribed period of time (a period between t1 and t2) for receiving command and address signals for the selected and activated bank is elapsed, leakage current can be reduced for the circuits included in the hierarchical power supply region. Therefore, leakage current in the period in which the bank is in the active state is also reduced in addition to that in the stand-by state.

Seventh Embodiment

Figure 17:
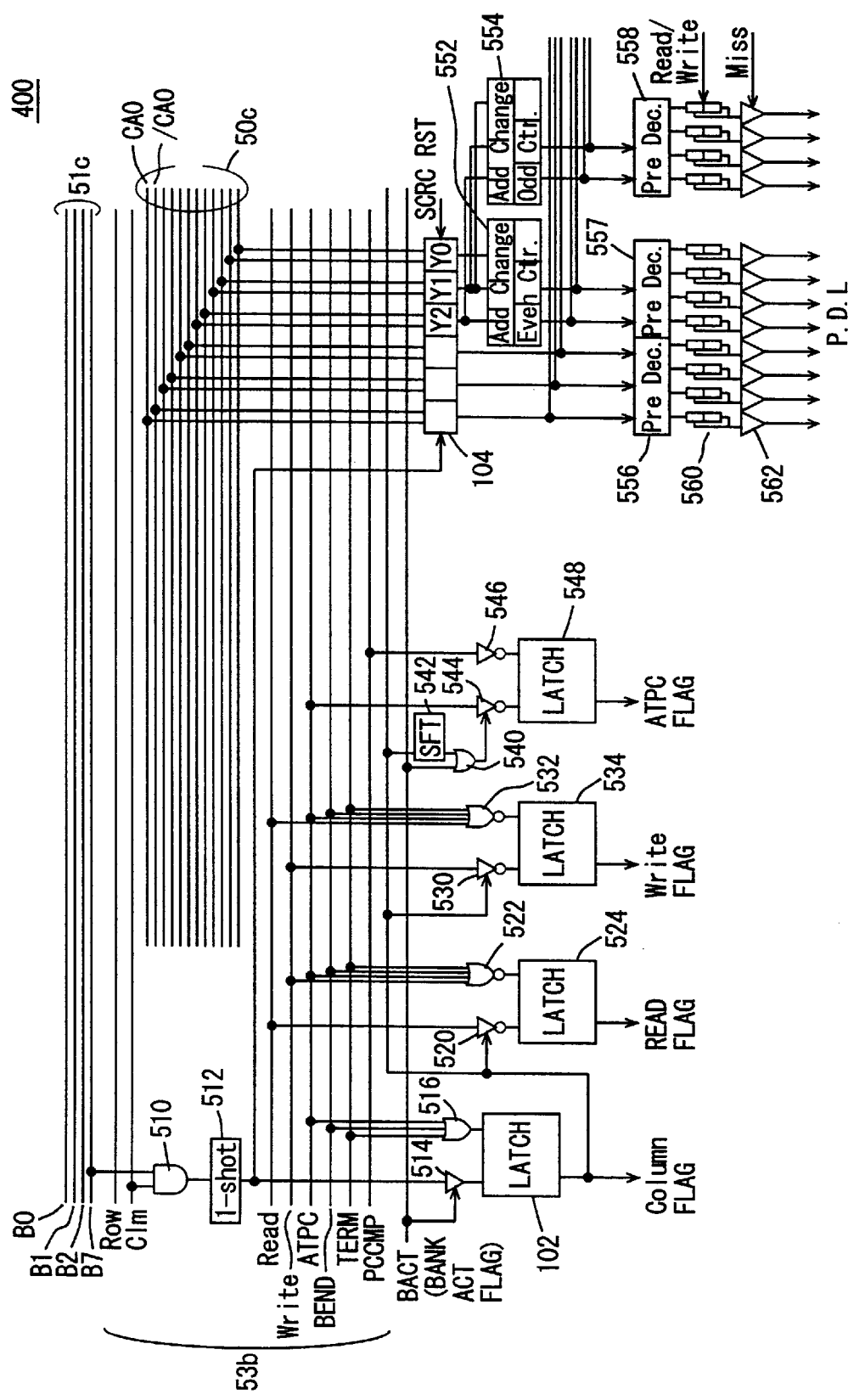
FIG. 17 is a block diagram showing a structure of a column predecoder in an SDRAM according to a seventh embodiment of the present invention.

Latch circuits according to the fourth and fifth embodiments shown in FIGS. 8 and 10 may also be used as latch circuits 102 and 104 in a column predecoder of an SDRAM shown in FIG. 17. The same applies to the other latch circuits 524, 534 and 548. Latch circuit 102 latches column related command signals Read, Write, ATPC, BEND, TERM and PCCMP. Latch circuit 104 latches a column address signal.

Figure 18:
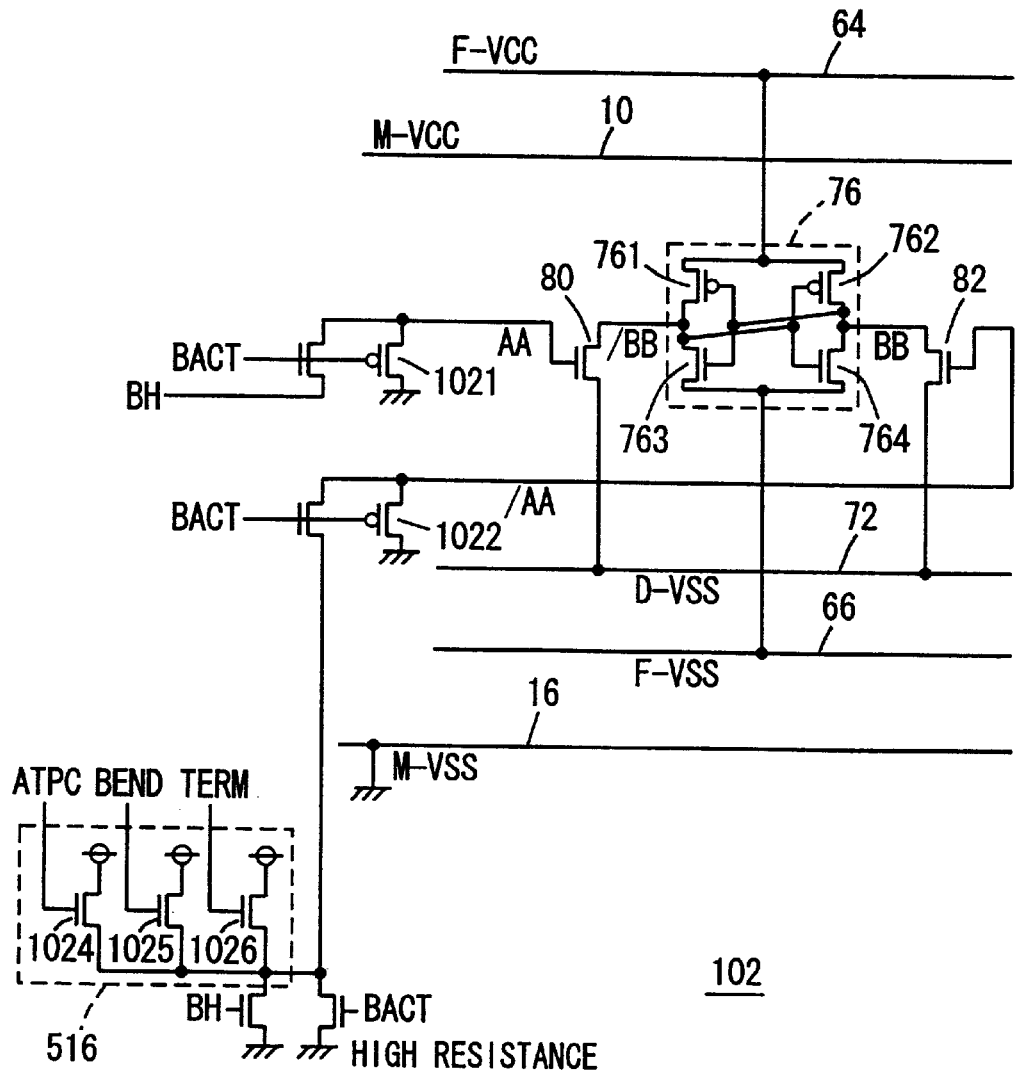
FIG. 18 is a circuit diagram showing a structure of a latch circuit receiving a command signal shown in FIG. 17.

Referring to FIG. 18, in a latch circuit 102, P channel MOS transistors 1021 and 1022 are connected to gates of transistors 80 and 82, respectively. Flag signals BACT generated upon activation of a bank are applied to gates of transistors 1021 and 1022. Further, in latch circuit 102, N channel MOS transistors 1024 to 1028 are provided which form a wired OR circuit 516 (FIG. 17).

Wired OR circuit 516 is also used for a portion which is generally formed of a CMOS logic circuit to recognize an attribute of an activation cycle upon activation of the bank, so that a determining speed is increased. A reset related signal (a wired OR logic output from an auto precharge ATPC, burst end BEND or termination TERM) is applied to the gate of transistor 82, and a bank activation related signal (a bank hit BH) is applied to the gate of transistor 80 for determining a latch operation as a flag by determining the H or L level of latch circuit 76. At the time of activation of the bank, gate voltages of transistors 80 and 82 respectively attain to the H and L levels in response to the input of bank hit signal BH, and output signals/BB and BB from latch circuit 76 respectively attain to the L and H levels. When burst end signal BEND is input upon completion of the bank operation, gate voltages of transistors 80 and 82 attain to the L level as bank hit signal BH is at the L level at the time, output signals/BB and BB from latch circuit 76 respectively attain to the H and L levels, and latch circuit 76 is reset.

Figure 19:
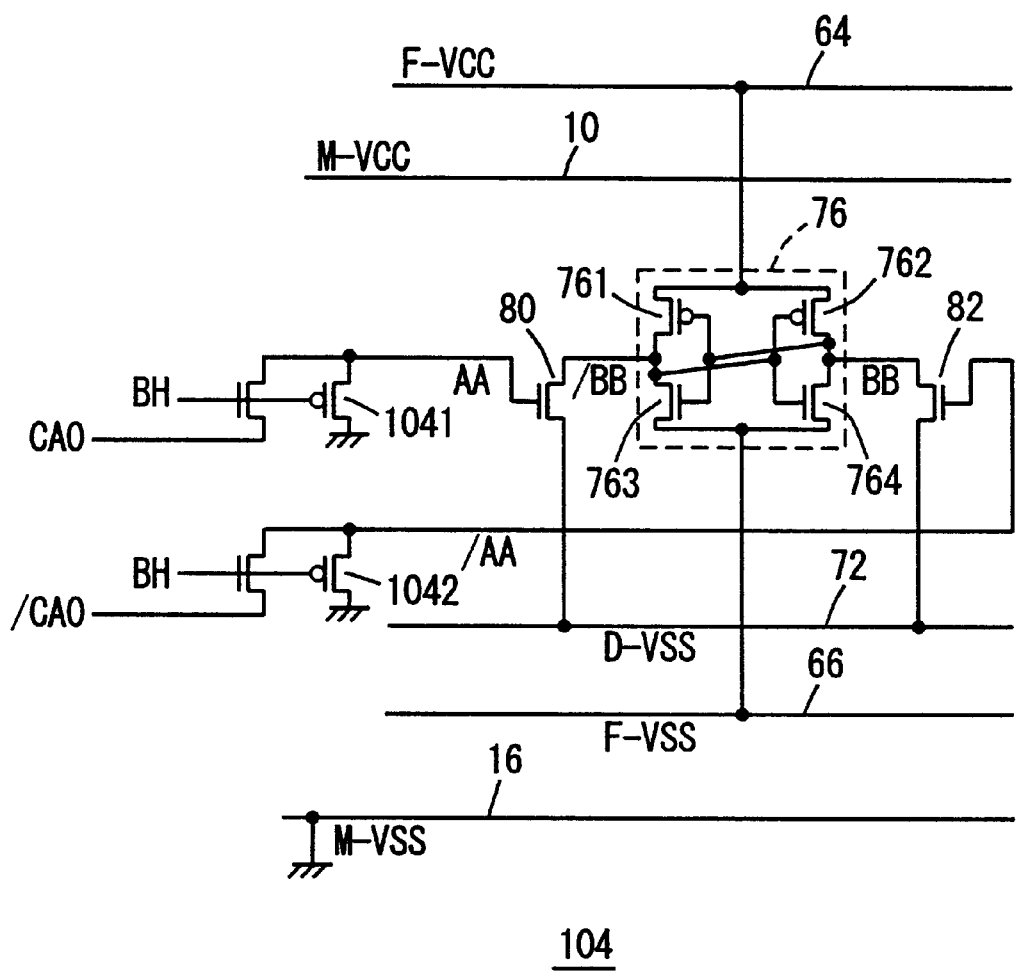
FIG. 19 is a circuit diagram showing a structure of a latch circuit receiving an address signal shown in FIG. 17.

Referring to FIG. 19, in a latch circuit 104, P channel MOS transistors 1041 and 1042 are connected to gates of transistors 80 and 82, respectively. Bank hit signals BH from a one shot pulse generating circuit 512 are applied to gates of transistors 1041 and 1042.

Detailed Description of Column Predecoder

A column predecoder of the SDRAM will now be described in detail for reference.

FIG. 17 is a schematic block diagram showing a structure of a column predecoder 400. Referring to FIG. 17, transmitted through a command bus 53*b* are: a read related access identification signal READ instructing a reading operation; a write related access identification signal WRITE instructing a writing operation; an auto precharge identification signal ATPC instructing an auto precharge operation; a burst end identification signal BEND instructing termination of a burst operation for every bank; a termination identification signal TERM instructing compulsory termination of a column selecting operation when another bank is selected during the column selecting operation; and a precharge operation identification signal PCCM instructing termination of a precharge operation.

A signal BACT is a flag signal which is held by level holding circuit 208 (FIG. 12) in accordance with selection of the bank.

A column predecoder circuit 34 includes: an AND circuit 510 receiving a bank address signal B3 corresponding to a signal Clm which is transmitted by command bus 53*b*; a one shot pulse generating circuit 512 outputting a one shot pulse signal in response to the activation of an output from AND circuit 510; a drive circuit 514 activated in response to activation of flag signal BACT for driving an output from one shot pulse generating circuit 512; an OR circuit 516 receiving signals ATPC, BEND and TERM; and a latch circuit 102 set and reset by outputs from drive circuit 514 and wired OR circuit 516, respectively, for outputting a column flag signal Col.FLAG indicating that a column related operation is activated.

Column predecoder circuit 34 further includes: an inverter circuit 520 activated in response to activation of column flag signal Col.FLAG for driving a signal READ transmitted by command bus 53*b*; an OR circuit 522 receiving signals WRITE, ATPC, BEND and TERM; and a latch circuit 524 set and reset by outputs from inverter circuit 520 and wired OR circuit 522, respectively, for outputting a read flag signal READ.FLAG indicating that a reading operation is activated.

Column predecoder circuit 34 further includes: an inverter circuit 530 activated in response to activation of column flag signal Col.FLAG for driving signal WRITE transmitted by command bus 53*b*; an OR circuit 532 receiving signals READ, ATPC, BEND and TERM; and a latch circuit 534 set and reset by outputs from inverter circuits 530 and wired OR circuit 532, respectively, for outputting a write flag signal WRITE.FLAG indicating that a writing operation is activated.

Column predecoder circuit 34 further includes: a shift circuit 542 receiving column flag signal Col.FLAG for delaying it by a prescribed clock time; an OR circuit 540 receiving a flag signal BACT and an output from shift circuit 542; an inverter circuit 544 activated in response to activation of an output from OR circuit 540 for driving signal ATPC transmitted by command bus 53*b*; an inverter circuit 546 receiving a signal PCCMP transmitted by command bus 53*b*; and a latch circuit 548 set and reset by outputs from inverter circuits 544 and 546, respectively, for outputting an auto precharge flag signal ATPC.FLAG indicating that an auto precharge operation is activated.

Column predecoder circuit 34 further includes a latch circuit 550 activated in response to an output signal from one shot pulse generating circuit 512 for receiving a column signal transmitted by address bus 50*c*. Latch circuit 550 is reset in response to activation of control signal SCRC.

Column predecoder circuit 34 further includes: even and odd bit adjusting circuits 552 and 554 each adjusting a lower bit of an address signal corresponding to a column selection line (not shown) which is activated in accordance with a lower bit of a column address held by latch circuit 550; a predecoder 556 predecoding an upper bit data from latch circuit 550; a predecoder 557 predecoding a lower bit data from even bit adjusting circuit 552, a predecoder 558 predecoding a lower bit data from odd bit adjusting circuit 554; a shift circuit 560 activated by signal READ or WRITE for delaying predecode signals from predecoders 556, 557 and 558 by a prescribed number of clocks (for example by two clocks) for output; and a drive circuit 562 activated in response to a signal Miss indicating that an address from a redundancy decoder (not shown) does not correspond to a defective address for receiving an output from shift circuit 560 and driving a level of a column predecode line in accordance with an output signal from shift circuit 560.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device having operation and stand-by modes, comprising:
a main power supply line receiving a power supply voltage;
a sub power supply line;
a first switching element connected between said main and sub power supply lines, turned on in said operation mode, and turned off in said stand-by mode;
a main ground line receiving a ground voltage;
a sub ground line;
a second switching element connected between said main and sub ground lines, turned on in said operation mode, and turned off in said stand-by mode;
a first buffer power supply line;
a first buffer ground line;
a second buffer power supply line;
a second buffer ground line;
a plurality of first logic circuits each connected between said first buffer power supply and first buffer ground lines for supplying an output signal at a first logic level in said stand-by mode;
a plurality of second logic circuits each connected between said second buffer power supply and second buffer ground lines for supplying an output signal at a second logic level complementary to said first logic level in said stand-by mode; and
a selecting circuit disposed to connect said first buffer power supply line to said main power supply line, said first buffer ground line to said sub ground line, said second buffer power supply line to said sub power supply line and said second buffer ground line to said main ground line when said plurality of first logic circuits supply output signals at a logic high level as said first logic level and said plurality of second logic circuits supply output signals at a logic low level as said second logic level in said stand-by mode, and disposed to connect said first buffer power supply line to said sub power supply line, said first buffer ground line to said main ground line, said second buffer power supply line to said main power supply line and said second buffer ground line to said sub ground line when said plurality of first logic circuits supply output signals at the logic low level as said first logic level and said plurality of second logic circuits supply output signals at the logic high level as said second logic level in said stand-by mode.

2. The semiconductor circuit device according to claim 1, wherein said selecting circuit includes:
a first selector selecting said main power supply line or said sub power supply line to connect the selected line to said first buffer power supply line;
a second selector selecting said main ground line or said sub ground line to connect the selected line to said first buffer ground line;
a third selector selecting said main power supply line or said sub power supply line to connect the selected line to said second buffer power supply line; and
a fourth selector selecting said main ground line or said sub ground line to connect the selected line to said second buffer ground line.

3. The semiconductor circuit device according to claim 2, wherein said first selector includes
a first P channel MOS transistor connected between said main power supply line and said first buffer power supply line, and
a second P channel MOS transistor connected between said sub power supply line and said first buffer power supply line, said second selector includes
a first N channel MOS transistor connected between said main ground line and said first buffer ground line, and
a second N channel MOS transistor connected between said sub ground line and said first buffer ground line, said third selector includes
a third P channel MOS transistor connected between said main power supply line and said second buffer power supply line, and
a fourth P channel MOS transistor connected between said sub power supply line and said second buffer power supply line, and said fourth selector includes
a third N channel MOS transistor connected between said main ground line and said second buffer ground line, and
a fourth N channel MOS transistor connected between said sub ground line and said second buffer ground line.

4. A semiconductor circuit device having operation and stand-by modes, comprising:
a main power supply line receiving a power supply voltage;
a sub power supply line;
a first switching element connected between said main and sub power supply lines, turned on in said operation mode, and turned off in said stand-by mode;
a main ground line receiving a ground voltage;
a sub ground line;
a second switching element connected between said main and sub ground lines, turned on in said operation mode, and turned off in said stand-by mode;
a plurality of first logic circuits each connected between said main power supply line and said sub ground line for supplying an output signal at a first logic level in said stand-by mode;
a plurality of second logic circuits each connected between said sub power supply line and said main ground line for supplying an output signal at a second logic level complementary to said first logic level in said stand-by mode;
a voltage supplying circuit disposed to supply a voltage lower than said ground voltage to said sub ground line when said plurality of first logic circuits supply output signals at a logic low level as said first logic level and said plurality of second logic circuits supply output signals at a logic high level as said second logic level in said stand-by mode, and disposed to supply a voltage higher than said power supply voltage to said sub power supply line when said plurality of first logic circuits supply output signals at the logic high level as said first logic level and said plurality of second logic circuits supply output signals at a logic low level as said second logic level in said stand-by mode.

5. The semiconductor circuit device according to claim 4, wherein said voltage supplying circuit includes:
a first selector selectively connecting said sub power supply line to a node receiving a voltage higher than said power supply voltage; and a second selector selectively connecting said sub ground line to a node receiving a voltage lower than said ground voltage.

6. The semiconductor circuit device according to claim 5, wherein said first selector includes a P channel MOS transistor connected between said node receiving the voltage higher than said power supply voltage and said sub power supply line, and said second selector includes an N channel MOS transistor connected between said node receiving the voltage lower than said ground voltage and said sub ground line.

7. A semiconductor circuit device having operation and stand-by modes, comprising:

a main power supply line;

a switching element connected between a node receiving a power supply voltage and said main power supply line, and turned on in said operation mode, and turned off in said stand-by mode;

a main ground line;

a latch fixed power supply line receiving said power supply voltage;

a latch fixed ground line receiving a ground voltage;

a plurality of logic circuits each connected between said main power supply and main ground line;

a latch circuit connected between said latch fixed power supply and latch fixed ground lines; and a blocking circuit disposed to block a signal input to said latch circuit in said stand-by mode.

8. The semiconductor circuit device according to claim 7, wherein said blocking circuit includes:

a latch driving power supply line;

a driving circuit disposed to supply said power supply voltage to said latch driving power supply line in said operation mode and supply said ground voltage or a voltage lower than said ground voltage to said latch driving power supply line in said stand-by mode; and an inverter circuit receiving a voltage from said latch driving power supply line and arranged on a signal input path to said latch circuit.

9. The semiconductor circuit device according to claim 7, wherein said blocking circuit includes:

a latch driving ground line;

a first driving circuit disposed to supply said ground voltage to said latch driving ground line in said operation mode and to supply a voltage higher than said ground voltage to said latch driving ground line in said stand-by mode;

a first transistor connected between one of input nodes of said latch circuit and said latch driving ground line and having its gate receiving a first signal; and a second transistor connected between the other of said input nodes of said latch circuit and said latch driving ground line and having its gate receiving a second signal complementary to said first signal.

10. The semiconductor circuit device according to claim 9, wherein said blocking circuit further includes:

a second driving circuit disposed to supply said power supply voltage to said latch fixed power supply line in said operation mode and to supply a voltage higher than said power supply voltage to said latch fixed power supply line in said stand-by mode; and a third driving circuit disposed to supply said ground voltage to said latch fixed ground line in said operation mode and to supply a voltage higher than said ground voltage to said latch fixed ground line in said stand-by mode.

11. The semiconductor circuit device according to claim 7, wherein said blocking circuit includes:

a latch driving ground line;

a first transistor connected between one of input nodes of said latch circuit and said latch driving ground line and having its gate receiving a first signal;

a second transistor connected between the other of said input nodes of said latch circuit and said latch driving ground line and having its gate receiving a second signal complementary to said first signal;

a first driving circuit disposed to temporarily supply said ground voltage to said latch driving ground line during input of said first and second signals in said operation mode and otherwise supply said power supply voltage to said latch driving ground line;

a second driving circuit disposed to supply said power supply voltage to said latch fixed power supply line in said operation mode and disposed to supply a voltage higher than said power supply voltage to said latch fixed power supply line in said stand-by mode; and a third driving circuit disposed to temporarily supply said power supply voltage to said latch fixed ground line during input of said first and second signals in said operation mode and otherwise supply said ground voltage to said latch fixed ground line in said operation mode, and disposed to supply a voltage higher than said ground voltage to said latch fixed ground line in said stand-by mode.

12. The semiconductor circuit device according to claim 9, further comprising a voltage supplying circuit disposed to supply said ground voltage to gates of said first and second transistors when said first and second signals are not input.

13. The semiconductor circuit device according to claim 7, wherein said semiconductor circuit device is a synchronous dynamic random access memory, and said latch circuit latches a row related command signal in said synchronous dynamic random access memory.

14. The semiconductor circuit device according to claim 7, wherein said semiconductor circuit device is a synchronous dynamic random access memory, and said latch circuit latches a row related address signal in said synchronous dynamic random access memory.

15. The semiconductor circuit device according to claim 7, wherein said semiconductor circuit device is a synchronous dynamic random access memory, and said latch circuit latches a column related command signal in said synchronous dynamic random access memory.

16. The semiconductor circuit device according to claim 7, wherein said semiconductor circuit device is a synchronous dynamic random access memory, and said latch circuit latches a column related address signal in said synchronous dynamic random access memory.

* * * * *